United States Patent
Sasagawa et al.

(10) Patent No.: US 9,059,219 B2
(45) Date of Patent: Jun. 16, 2015

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shinya Sasagawa, Chigasaki (JP); Hiroshi Fujiki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 31 days.

(21) Appl. No.: 13/911,476

(22) Filed: Jun. 6, 2013

(65) Prior Publication Data

US 2014/0004656 A1  Jan. 2, 2014

(30) Foreign Application Priority Data

Jun. 27, 2012   (JP) .................................. 2012-144728

(51) Int. Cl.
  *H01L 29/66* (2006.01)
  *H01L 29/786* (2006.01)
(52) U.S. Cl.
  CPC .... *H01L 29/66969* (2013.01); *H01L 29/66742* (2013.01); *H01L 29/78648* (2013.01); *H01L 29/7869* (2013.01); *H01L 29/78696* (2013.01)
(58) Field of Classification Search
  USPC ....................................................... 438/104
  See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

(Continued)

*Primary Examiner* — Angel Roman
(74) *Attorney, Agent, or Firm* — Eric J. Robinson; Robinson Intellectual Property Law Office, P.C.

(57) ABSTRACT

Provided is a method for manufacturing a transistor by which the defective shape of a semiconductor device is prevented in the case where a source electrode layer and a drain electrode layer are formed on an oxide semiconductor film. A source electrode layer and a drain electrode layer are formed each having a cross-sectional shape with which disconnection of a gate insulating film is unlikely to occur even when the gate insulating film over the source electrode layer and the drain electrode layer has a small thickness. An oxide semiconductor film having a crystal structure over an insulating surface is formed; an electrode layer on the oxide semiconductor film is formed; and a thickness of an exposed portion of the oxide semiconductor film is reduced by exposing the oxide semiconductor film to dilute hydrofluoric acid with a concentration higher than 0.0001% and lower than or equal to 0.25%.

20 Claims, 23 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0320458 A1 | 12/2010 | Umeda et al. |
| 2010/0320459 A1 | 12/2010 | Umeda et al. |
| 2011/0024751 A1 | 2/2011 | Yamazaki et al. |
| 2011/0089414 A1 | 4/2011 | Yamazaki et al. |
| 2011/0136301 A1 | 6/2011 | Yamazaki et al. |
| 2011/0156026 A1 | 6/2011 | Yamazaki et al. |
| 2011/0180796 A1 | 7/2011 | Yamazaki et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0305913 A1 | 12/2012 | Yamazaki et al. |
| 2013/0009219 A1 | 1/2013 | Yamazaki et al. |
| 2013/0087785 A1 | 4/2013 | Akimoto et al. |
| 2013/0089950 A1 | 4/2013 | Akimoto et al. |
| 2013/0099233 A1 | 4/2013 | Tochibayashi et al. |
| 2013/0193432 A1 | 8/2013 | Yamazaki |
| 2013/0277676 A1 | 10/2013 | Yamazaki |
| 2013/0320330 A1 | 12/2013 | Yamazaki |
| 2013/0334523 A1 | 12/2013 | Yamazaki |
| 2013/0334533 A1 | 12/2013 | Yamazaki |
| 2014/0001465 A1 | 1/2014 | Yamazaki |
| 2014/0021464 A1* | 1/2014 | Ting et al. ............... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-231613 | 10/2009 |
| JP | 2010-016347 | 1/2010 |
| JP | 4415062 | 2/2010 |
| JP | 2010-067954 | 3/2010 |

(56) References Cited

FOREIGN PATENT DOCUMENTS

| JP | 2010-177431 | | 8/2010 |
|----|-------------|---|--------|
| JP | 4571221 | | 10/2010 |
| JP | 2011-103458 | A | 5/2011 |
| JP | 2011-171721 | A | 9/2011 |
| JP | 2012-160679 | | 8/2012 |
| WO | WO-2004/114391 | | 12/2004 |
| WO | WO 2008/133345 | | 11/2008 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of The 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properities,", J. Appl. Phys. (Journal of Applied Physics), Feb. 1, 2003, vol. 93, No. 3, pp. 1624-1630.

Asakuma.N. et al., "Crystallization and Reduction of Sol-gel-Derived Zinc Oxide Films by Irradiation With Ultraviolet Lamp,", Journal of Sol-gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Contolled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H at al., "White Stacked Electrophosphorecent Organic Light-Emitting Devices Employing MOO3 as a Charge-Generation Layer,", Adv. Mater. (Advancec Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID Internatioanl Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2997, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power driving Technology,", SID Digest '09 : SID International Symposium Digest of Technical Papers, May 31, 2009, pp. 395-398.

Lee,H et al., "Current Status of, Challenges to, and Perspective View of AM-OLED ,", IDW '06 : Proceedings of The 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl, Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122101-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al. "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1995, vol. 198-200, pp. 165-169.

Mo.Y et al., "Amorphous Oxide TFT Backplanes for Large Size AMOLED Displays,", IDW '08 : Proceedings of The 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

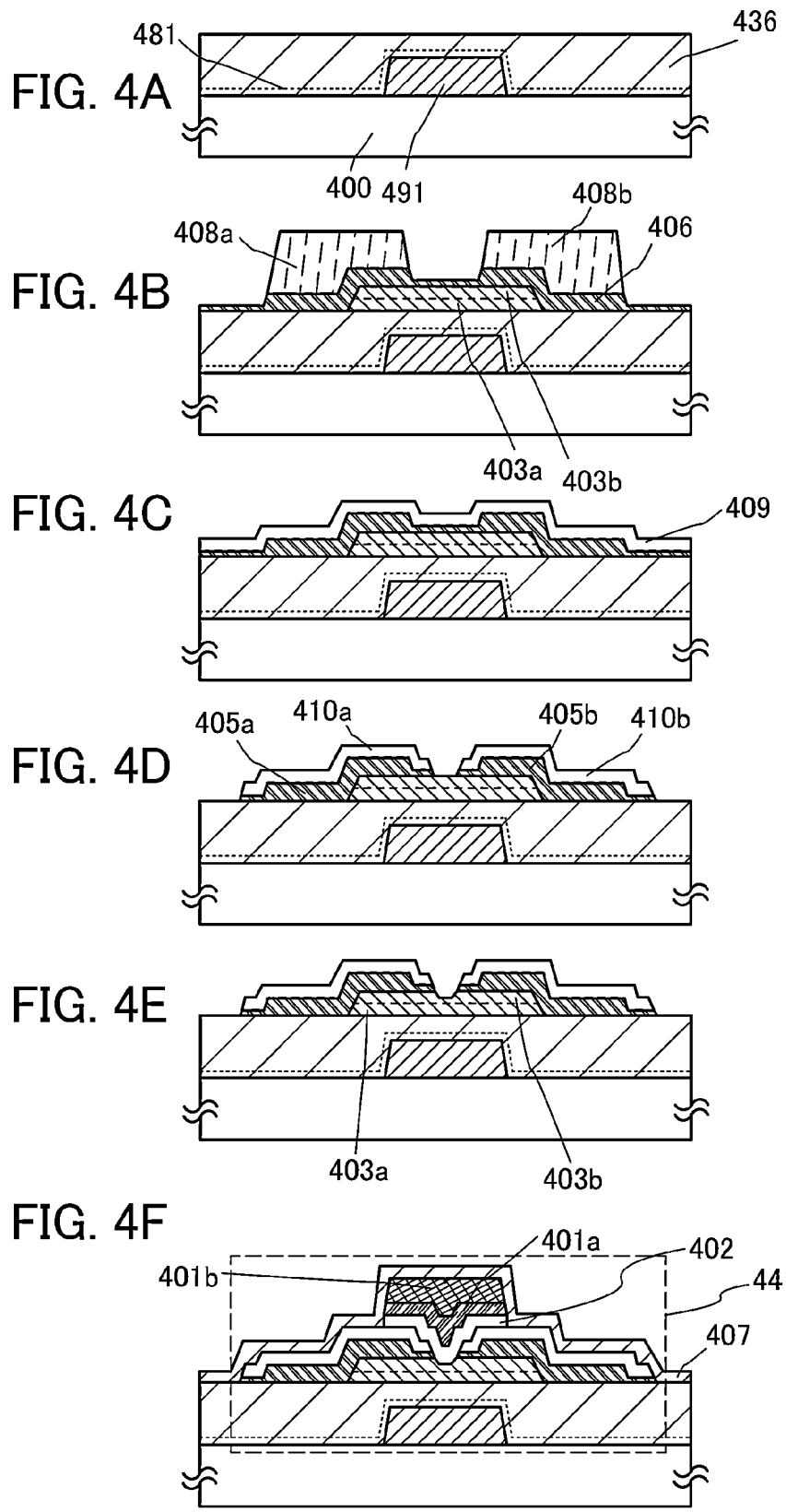

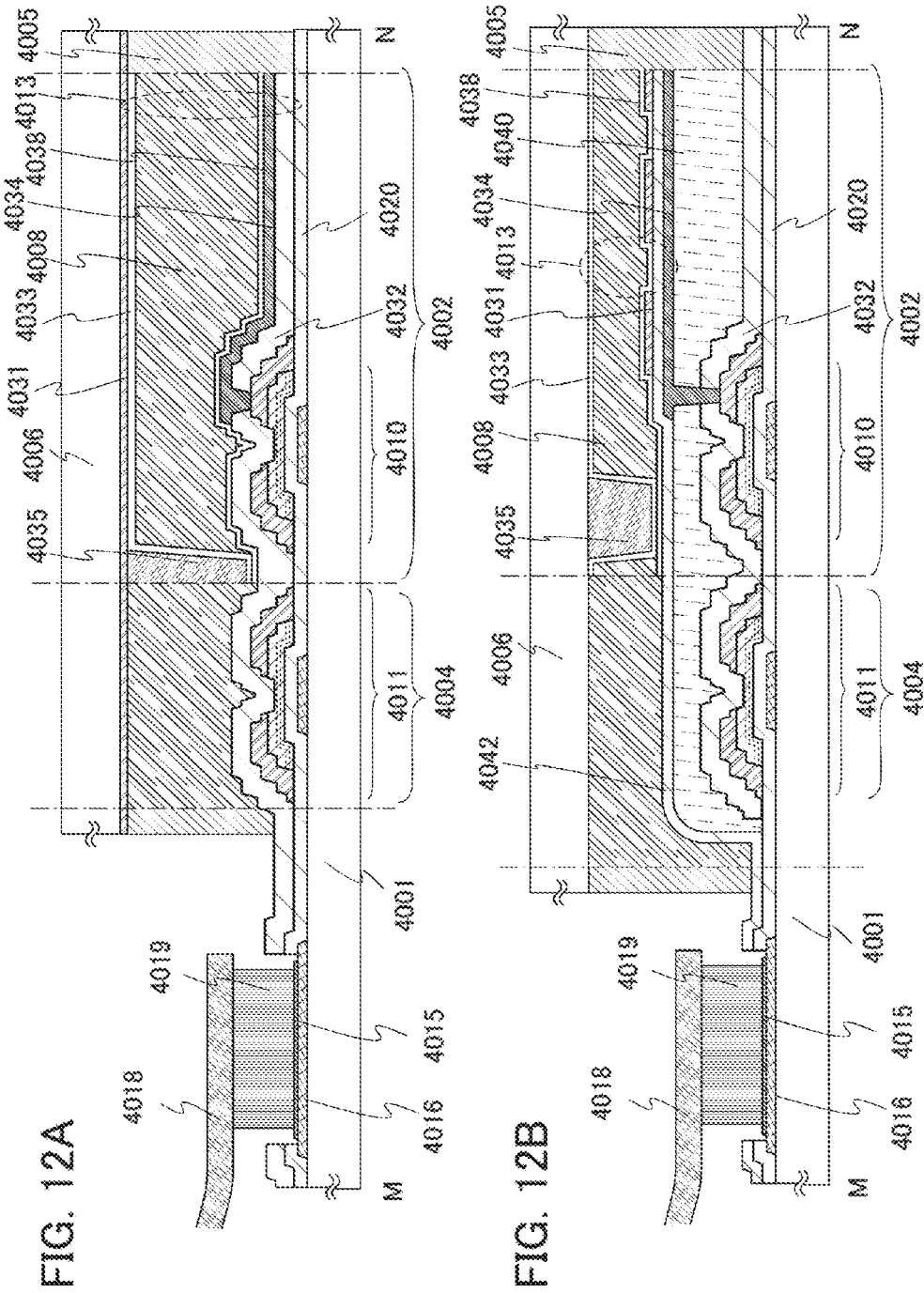

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device including an oxide semiconductor and a method for manufacturing the semiconductor device.

In this specification, a semiconductor device generally means a device which can function by utilizing semiconductor characteristics, and an electrooptic device, a semiconductor circuit, and an electronic device are all semiconductor devices.

2. Description of the Related Art

A technique for manufacturing a transistor or the like including an oxide semiconductor film for a channel formation region and applying it to a display device has been attracting attention. Examples of such a transistor include a transistor in which zinc oxide (ZnO) is used for an oxide semiconductor film and a transistor in which $InGaO_3(ZnO)$, is used for an oxide semiconductor film. A technique for manufacturing such a transistor including an oxide semiconductor film over a light-transmitting substrate and applying it to a switching element or the like of an image display device is disclosed in Patent Documents 1 and 2.

Further, Patent document 3 discloses a structure of a transistor including a source electrode and a drain electrode in contact with an oxide semiconductor layer, a gate electrode overlapping with the oxide semiconductor layer, and a gate insulating film provided between the oxide semiconductor layer and the gate electrode, in which the source electrode and the drain electrode each include a first conductive layer and a second conductive layer having a region which extends in a channel length direction beyond an end portion of the first conductive layer.

In Patent Document 4, a structure in which gate electrodes are formed above and below an oxide semiconductor layer is disclosed.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-171721
[Patent Document 4] Japanese Published Patent Application No. 2011-103458

SUMMARY OF THE INVENTION

When a transistor having a dual-gate structure in which gate electrodes are formed above and below an oxide semiconductor film, a transistor having a bottom-gate structure, or a transistor having a top-gate structure is formed, an electrode layer is formed over and in contact with the oxide semiconductor film so that part of a surface of the oxide semiconductor film is not covered with the electrode layer, in some cases. In these cases, it is preferable that the electrode layer be etched with the sufficient selectivity of the electrode layer with respect to the oxide semiconductor film.

However, it is difficult to perform etching treatment with a sufficiently high selectivity of the electrode layer with respect to the oxide semiconductor film. Especially in the case where the thickness of the oxide semiconductor film is small, the oxide semiconductor film might be partly removed so that an underlying layer is exposed at the time of etching of the electrode layer. In addition, a defective shape of the electrode layer and formation of an opening in the oxide semiconductor film might be caused depending on the etching conditions. Such a defective shape of a semiconductor device lowers electrical characteristics.

One object of one embodiment of the present invention is to provide a method for manufacturing a transistor by which the above defective shape of a semiconductor device is prevented in the case where a source electrode layer and a drain electrode layer are formed over and in contact with an oxide semiconductor film.

Another object of one embodiment of the present invention is to provide a transistor structure in which a source electrode layer and a drain electrode layer are over an oxide semiconductor film and electric-field concentration which might occur in end portions of the source electrode layer and the drain electrode layer is reduced.

Another object of one embodiment of the present invention is to give stable electrical characteristics to a semiconductor device including a transistor in which an oxide semiconductor film is used for a channel formation region and to improve reliability of the semiconductor device.

Another object of one embodiment of the present invention is to form a source electrode layer and a drain electrode layer each having a cross-sectional shape with which disconnection of a gate insulating film is unlikely to occur even when the gate insulating film over the source electrode layer and the drain electrode layer or an oxide semiconductor film has a small thickness.

As a base film, an oxide semiconductor film having a crystal structure is used. A single-layer metal film is formed over the base film. After that, a resist mask is formed, and etching is performed plural times. Accordingly, electrodes each including a projecting portion when seen in cross-section are formed.

Specifically, the resist mask is formed over the metal film, first etching is performed to remove the metal film to approximately half the thickness so that the metal film partly has a small thickness, and ashing is performed on the resist mask for reducing the area of the resist mask. After that, second etching is performed with the resist mask, which is reduced in size, so that single-layer metal films each including the projecting portion are formed.

In the case where an oxide semiconductor film having a crystal structure is used as the base film, when or after a single-layer metal film in contact with the oxide semiconductor film having a crystal structure is processed, wet etching may be performed with the use of the metal film as a mask so as to form a thin region (that is, a region which has a smaller thickness than a region overlapping with the metal film and does not overlap with the metal film) in the oxide semiconductor film. In such a case, a transistor in which the thin region serves as a channel formation region can be manufactured.

The thin region in the oxide semiconductor film, which serves as the channel formation region, is formed by wet etching using dilute hydrofluoric acid. The concentration of dilute hydrofluoric acid is preferably lower than or equal to 0.25%. Dilute hydrofluoric acid is preferably further diluted with water to extremely low concentration, for example, 0.0025%. With such dilute hydrofluoric acid, the etching rate of an oxide semiconductor film having a crystal structure can be about three times lower than that of an oxide semiconductor film having an amorphous structure and further, the etching direction can be different from that of the electrode layer. The oxide semiconductor film having a crystal structure can be anisotropically etched with the use of such dilute hydrofluoric acid, which enables the electrode layer and the oxide semiconductor film to have favorable cross-sectional shapes. Meanwhile, the oxide semiconductor film having an amorphous structure can be isotropically etched with the use of such dilute hydrofluoric acid.

One embodiment of the invention disclosed in this specification is a method for manufacturing a semiconductor device including the following steps: forming an oxide semiconductor film having a crystal structure over an insulating surface, forming an electrode layer over and in contact with a part of the oxide semiconductor film, and exposing the oxide semiconductor film to dilute hydrofluoric acid with a concentration higher than 0.0001% and lower than or equal to 0.25% to reduce a thickness of an exposed portion of the oxide semiconductor film.

In the case where a source electrode layer and a drain electrode layer are formed over the oxide semiconductor film, the source electrode layer and the drain electrode layer each including a projecting portion extending in the channel length direction can be formed by the above steps. When a gate insulating film is formed over the source electrode layer and the drain electrode layer each having such a cross-sectional shape, disconnection of the gate insulating film is unlikely to occur even when the gate insulating film or the oxide semiconductor film has a small thickness. Further, when the source electrode layer and the drain electrode layer each including the projecting portion extending in the channel length direction are formed using a single-layer metal film, the manufacturing process can be simple as compared with a case of using a stack of metal films.

The projecting portion of the source (drain) electrode layer which overlaps with the oxide semiconductor film reduces the electric-field concentration which might occur at end portions of the source (drain) electrode layer and thus contributes to improvement in electrical characteristics and reliability of a transistor.

By providing gate electrode layers above and below the oxide semiconductor film and setting the potential of one of the gate electrode layers to GND, the threshold voltage of the transistor is increased, so that a normally-off transistor can be provided.

In addition, the gate electrode layer having a potential of GND has a function of blocking an external electric field, that is, a function of preventing an external electric field (particularly, a function of preventing static electricity) from affecting a transistor. The blocking function of the gate electrode layer having a potential of GND can prevent variation in electrical characteristics of the transistor due to the effect of an external electric field such as static electricity.

Through the above steps, the source electrode layer and the drain electrode layer are formed and then the oxide semiconductor film is subjected to wet etching using the electrode layer as a mask to form a thin region in the oxide semiconductor film, which serves as a channel formation region, whereby performance of a transistor can be improved. Further, the electric field concentration which might occur between the source electrode layer and the drain electrode layer can be reduced.

By the wet etching performed on the oxide semiconductor film using dilute hydrofluoric acid, the thickness of the channel formation region (thin region) can be controlled more accurately, and in addition, contaminants in the vicinity of the channel formation region (thin region) can be reduced.

Since the source electrode layer and the drain electrode layer each includes the projecting portion extending in the channel length direction, disconnection of the gate insulating film is unlikely to occur even when the gate insulating film over the source electrode layer and the drain electrode layer or the oxide semiconductor film has a small thickness. When the source electrode layer and the drain electrode layer each including the projecting portion extending in the channel length direction are formed using a single-layer metal film, the process can be simple In a dual-gate structure in which gate electrodes are formed above and below an oxide semiconductor film, a conductive layer serving as the gate electrode located below the oxide semiconductor film is provided so as to be embedded in an oxide insulating film. In the oxide insulating film, an oxygen-excess region which contains oxygen whose proportion is higher than that in the stoichiometric composition of the oxide semiconductor film exists in the vicinity of the bottom surface of the oxide insulating film and the vicinity of the conductive layer in a region where the conductive layer exists.

The oxygen-excess region can be formed by forming a conductive layer, forming an oxide insulating film over the conductive layer, and then performing oxygen adding treatment (oxygen doping treatment) on the oxide insulating film whose top surface includes a projecting portion reflecting the shape of the conductive layer. After forming the oxygen-excess region, planarization treatment is performed on the oxide insulating film in order to remove the projecting portion of the top surface. For the planarization treatment, a chemical mechanical polishing method is employed.

By the planarization treatment, the oxide insulating film over the conductive layer is selectively removed to be thin, whereby the distance between the oxygen-excess region over the conductive layer and the top surface of the oxide insulating film becomes shorter. In contrast, a region of the oxide insulating film, which is not over the conductive layer, is hardly removed, and the oxygen-excess region exists in the vicinity of the bottom surface of the oxide insulating film. Thus, in the oxide insulating film, the oxygen-excess region is provided at a shallow position from the top surface of the oxide insulating film in the region which is over the conductive layer and is provided at a deep position from the top surface of the oxide insulating film in another region (i.e., the region which is not over the conductive layer).

This means that in part of the oxide insulating film over which the oxide semiconductor film (at least the channel formation region) is provided and which overlaps with the conductive layer, the oxygen-excess region can be provided close to the oxide semiconductor film; thus, oxygen can be efficiently supplied from the oxygen-excess region to the oxide semiconductor film. Supply of oxygen can be promoted by heat treatment.

Thus, in the semiconductor device, oxygen vacancies in the oxide semiconductor film and at the interface between the oxide insulating film and the oxide semiconductor film can be compensated efficiently.

As the oxide semiconductor film, a stack of oxide semiconductor films having different compositions can be used.

In the case where two oxide semiconductor films are stacked, for example, a stack of films in which an In—Ga—Zn-based oxide film formed with a target containing In, Ga, and Zn at an atomic ratio of 3:1:2 (=1/2:1/6:1/3) and an In—Ga—Zn-based oxide film formed with a target containing In, Ga, and Zn at an atomic ratio of 1:1:1 (=1/3:1/3:1/3) are stacked in that order can be used.

In that case, the oxide semiconductor film including the thin region is preferably an In—Ga—Zn-based oxide film formed using a target containing In, Ga, and Zn at an atomic ratio of 1:1:1.

In the case where three oxide semiconductor films are stacked, for example, a stack of films in which an In—Ga—Zn-based oxide film formed with a target containing In, Ga, and Zn at an atomic ratio of 1:3:2 (=1/6:1/2:1/3), an In—Ga—Zn-based oxide film formed with a target containing In, Ga, and Zn at an atomic ratio of 3:1:2, and an In—Ga—Zn-based oxide film formed with a target containing In, Ga, and Zn at an atomic ratio of 1:1:1 are stacked in that order can be used.

In that case, the oxide semiconductor film including the thin region is preferably an In—Ga—Zn-based oxide film formed using a target containing In, Ga, and Zn at an atomic ratio of 1:1:1.

For another example, in the case where three oxide semiconductor films are stacked, a stack of films in which an In—Ga—Zn-based oxide film formed with a target containing In, Ga, and Zn at an atomic ratio of 1:1:1, an In—Ga—Zn-based oxide film formed with a target containing In, Ga, and Zn at an atomic ratio of 3:1:2, and an In—Ga—Zn-based oxide film formed with a target containing In, Ga, and Zn at an atomic ratio of 1:3:2 are stacked in that order can be used.

In that case, the oxide semiconductor film including the thin region is preferably an In—Ga—Zn-based oxide film formed using a target containing In, Ga, and Zn at an atomic ratio of 1:3:2.

In the case where a single layer of an oxide semiconductor film is used, the oxide semiconductor film including the thin region preferably remains on the base film so that a surface of the base film in contact with the oxide semiconductor film is not exposed.

In the case where a stack of oxide semiconductor films having different compositions is used, a first oxide semiconductor film including a thin region preferably remains on a second oxide semiconductor film which is in contact with the first oxide semiconductor film so that a surface of the second oxide semiconductor film is not exposed.

In the above structure, an insulating layer may be further provided so as to overlap with the source electrode layer and the drain electrode layer, and a gate insulating film may be provided over and in contact with the insulating layer. This insulating layer reduces parasitic capacitance formed between the gate electrode layer and the source electrode layer and parasitic capacitance formed between the gate electrode layer and the drain electrode layer. Further, this insulating layer is formed using a silicon oxide film, a silicon oxynitride film, or the like, and protects the source electrode layer and the drain electrode layer when the gate insulating film or the gate electrode layer is etched.

Further, an insulating film containing gallium is preferably used as a gate insulating film. Examples of the insulating film are a gallium oxide film (also referred to as $GaO_X$: X is not necessarily a natural number), a $Ga_2O_3$ ($Gd_2O_3$) film, and an insulating In—Ga—Zn-based oxide film which has a low indium content. The insulating film containing gallium preferably contains much oxygen; thus the formation conditions of the insulating film containing gallium are made so that the insulating film containing gallium contains much oxygen, or oxygen doping treatment is performed after the insulating film containing gallium is formed.

Note that the "oxygen doping" means that oxygen (which includes at least one of an oxygen radical, an oxygen atom, an oxygen molecule, ozone, an oxygen ion (oxygen molecular ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

A gas containing oxygen can be used for the oxygen doping treatment. As the gas containing oxygen, oxygen, dinitrogen monoxide, nitrogen dioxide, carbon dioxide, carbon monoxide, and the like can be used. A rare gas may be included in the gas containing oxygen for the oxygen doping treatment.

Depending on the conditions of the oxygen doping treatment, not only a film which is directly exposed to the oxygen doping treatment but also a film which is provided below the film can be doped with oxygen. That is, when the gate insulating film which is formed using a gallium oxide film is formed over the oxide semiconductor film and oxygen doping treatment is performed, oxygen can be added not only to the gate insulating film but also to the oxide semiconductor film.

The oxide semiconductor film preferably has a crystal structure. The oxide semiconductor film having a crystal structure is a single crystal film, a microcrystalline film, a polycrystalline (also referred to as polycrystal) film, or a c-axis aligned crystalline oxide semiconductor (CAAC-OS) film.

Another embodiment of the present invention is a semiconductor device including an oxide semiconductor film having a cross-sectional shape in which the thickness of a boundary region between a thin region (region not overlapping with a metal film) and a thick region (region overlapping with the metal film) increases. The semiconductor device includes a conductive layer; an oxide insulating film over the conductive layer; a first insulating film over the oxide insulating film; an oxide semiconductor film including a channel formation region over and in contact with the first insulating film; a source electrode layer and a drain electrode layer which are electrically connected to the oxide semiconductor film and are over the oxide semiconductor film; and a second insulating film over the oxide semiconductor film, the source electrode layer, and the drain electrode layer. The oxide semiconductor film has a cross-sectional shape in which the thickness of a boundary region between a thin region and a thick region increases. In the above structure, it is particularly preferable that the oxide semiconductor film be a CAAC-OS film. With the use of a CAAC-OS film, the oxide semiconductor film can have the following cross-sectional shape: the thickness of the boundary region between the thin region (region not overlapping with the metal film, specifically, the channel formation region) and the thick region (region overlapping with the metal film, that is, a region in contact with the source electrode layer or the drain electrode layer) increases and the boundary region has a smooth forward tapered slope; that is, an angle between a surface of the boundary region and the top surface of the oxide insulating film is greater than 0° and less than 90°, preferably greater than or equal to 20° and less than or equal to 70°. In the cross-sectional shape, the thickness of the boundary region gradually increases from a boundary with the thin region toward a boundary with the metal film, resulting in no large step. Thus, the coverage with the gate insulating film and the gate electrode layer formed over the oxide semiconductor film can be improved. In addition, even when the thickness of the gate insulating film is small, disconnection of the gate insulating film is unlikely to occur.

A thin channel formation region in the CAAC-OS film can prevent degradation of switching characteristics of a transistor and improve electrical characteristics thereof.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. To improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

With the use of the CAAC-OS film in a transistor, change in electrical characteristics of the transistor due to irradiation with visible light or ultraviolet light can be reduced. Thus, by using a CAAC-OS film as the oxide semiconductor film, it is possible to provide a highly reliable semiconductor device in which change in electrical characteristics of the transistor due to irradiation with visible light or ultraviolet light can be suppressed.

In the case where the oxide semiconductor film is a CAAC-OS film, the first insulating film and the second insulating film which are in contact with the CAAC-OS film preferably have amorphous structures. Specifically, the first insulating film and the second insulating film are formed at a temperature lower than a film formation temperature of the CAAC-OS film or are formed using a rare gas (e.g., argon) as a film formation gas for sputtering.

Oxygen doping treatment may be performed on the first insulating film containing gallium oxide so that the first insulating film has an amorphous structure, and an oxygen-excess region which contains oxygen whose proportion is higher than that in the stoichiometric composition of the first insulating film containing gallium oxide may be formed. For example, in the case of a gallium oxide film represented by $Ga_2O_3$, the oxygen-excess region is $GaO_X$ (X>1.5). The first insulating film including the oxygen-excess region prevents oxygen from being released from the oxide semiconductor film and effectively supplies oxygen to the oxide semiconductor film.

Oxygen doping treatment may be performed on the second insulating film containing gallium oxide so that the second insulating film has an amorphous structure, and an oxygen-excess region which contains oxygen whose proportion is higher than that in the stoichiometric composition of the second insulating film containing gallium oxide may be formed. The second insulating film including the oxygen-excess region prevents oxygen from being released from the oxide semiconductor film and effectively supplies oxygen to the oxide semiconductor film.

As the oxide semiconductor film, a semiconductor film containing gallium (e.g., an In—Ga—Zn-based oxide film) is used, and insulating films containing gallium (e.g., a gallium oxide film) are provided above and below and in contact with the oxide semiconductor film to sandwich the oxide semiconductor film. In such a case, the insulating films provided above and below the oxide semiconductor film contain the same constituent material as that of the oxide semiconductor film, and thus the state of each interface between the oxide semiconductor film and the insulating films can be excellent, which gives stable electrical characteristics. By providing the insulating films, which contain gallium oxide, above and below and in contact with the oxide semiconductor film to sandwich the oxide semiconductor film, the insulating films can prevent impurities such as nitrogen and a metal element, which might affect the oxide semiconductor film, from entering from the outside by diffusion. Accordingly, when the insulating films containing gallium oxide are provided so that the oxide semiconductor film is sandwiched therebetween or covered therewith, the composition and the purity of the oxide semiconductor film surrounded are kept constant, which gives stable electrical characteristics.

In this specification, the thin region in the oxide semiconductor film serves as a channel formation region. The distance between adjacent lower edge portions of the source electrode layer and the drain electrode layer extending in the channel length direction is a channel length.

In this specification, "etching rate" (also referred to as "etching speed") means the amount of etching in the thickness direction per minute. The unit for the "etching rate" is "nm/min".

In this specification, the term "contaminant" is used for a substance that causes variations or a drop in electrical characteristics of a transistor or a reduction in reliability.

After a source electrode layer and a drain electrode layer are formed over and in contact with an oxide semiconductor film, wet etching using dilute hydrofluoric acid is performed to prevent a defective shape of a semiconductor device from being formed. The wet etching using dilute hydrofluoric acid removes part of a surface of the oxide semiconductor film to which impurities such as Cl, Al, C, or B are adhered to form a thin region that serves as a channel formation region; thus, variations in electrical characteristics can be reduced.

Even when the thickness of the thin region is less than or equal to 20 nm, the oxide semiconductor film can be prevented from being partly removed. With the oxide semiconductor film whose channel formation region is thinned, the performance of a transistor can be improved.

The source electrode layer and the drain electrode layer each having a cross-sectional shape with which disconnection of the gate insulating film is unlikely to occur even when the gate insulating film has a thickness less than or equal to 20 nm or the oxide semiconductor film (the thick region) has a thickness less than or equal to 30 nm.

When insulating films containing gallium oxide which are above and below and in contact with the oxide semiconductor film is provided so that the oxide semiconductor film is sandwiched therebetween, electrical characteristics become stable and reliability can be improved.

BRIEF DESCRIPTION OF THE DRAWINGS

FIGS. 4A to 4F are cross-sectional views illustrating manufacturing steps of one embodiment of the present invention.

FIGS. 12A and 12B are cross-sectional views each illustrating one embodiment of the present invention.

DETAILED DESCRIPTION OF THE INVENTION

Figure 1A:
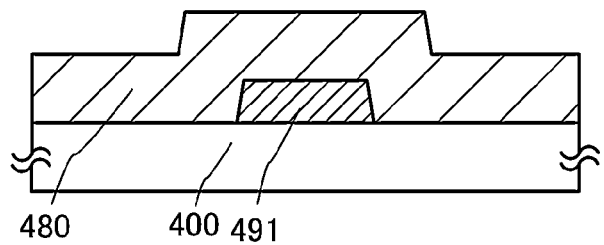
FIGS. 1A to 1F are cross-sectional views illustrating manufacturing steps of one embodiment of the present invention.
Figure 1B:
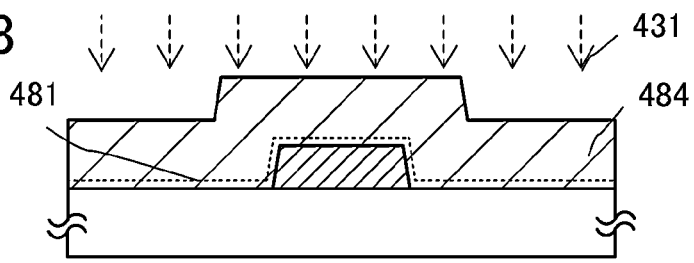

Hereinafter, embodiments and examples of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments and the examples.

(Embodiment 1)

In this embodiment, one embodiment of a semiconductor device and a method for manufacturing the semiconductor device is described with reference to FIGS. 1A to 1F. In this embodiment, an example of a method for manufacturing a transistor including an oxide semiconductor film is described.

First, a conductive film is formed over a substrate 400 having an insulating surface by a sputtering method, an evaporation method, or the like, and the conductive film is etched, whereby a conductive layer 491 is formed.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The conductive layer 491 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the conductive layer 491. The conductive layer 491 may have a single-layer structure or a stacked-layer structure.

The conductive layer 491 can also be formed using a conductive material such as indium tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the conductive layer 491 has a stacked-layer structure of the above conductive material and the above metal material.

To obtain a normally-off switching element, it is preferable that the threshold voltage of the transistor is made positive by using a material having a work function of 5 eV (electron volts) or higher, preferably 5.5 eV or higher, for the conductive layer 491. Specifically, a material which includes an In—N bond and has a specific resistivity of $1 \times 10^{-4}$ Ω·cm to $1 \times 10^{-1}$ Ω·cm, preferably $1 \times 10^{-4}$ Ω·cm to $5 \times 10^{-2}$ Ω·cm, is used for the conductive layer 491. Examples of the material are an In—Ga—Zn-based oxide film containing nitrogen, an In—Sn—O film containing nitrogen, an In—Ga—O film containing nitrogen, an In—Zn—O film containing nitrogen, an In—O film containing nitrogen, and a metal nitride film (e.g., an InN film).

Next, an oxide insulating film 480 is formed over the substrate 400 and the conductive layer 491 (see FIG. 1A). The oxide insulating film 480 has a projecting portion reflecting the shape of the conductive layer 491 on its surface.

The oxide insulating film 480 can be formed by a plasma CVD method, a sputtering method, or the like, using silicon oxide, silicon oxynitride, aluminum oxide, aluminum oxynitride, hafnium oxide, gallium oxide, zinc oxide, or a mixed material of any of these materials. The oxide insulating film 480 may have either a single-layer structure or a stacked-layer structure.

A silicon oxide film formed by a sputtering method is used as the oxide insulating film 480 in this embodiment. Alternatively, a silicon oxynitride film formed by a plasma CVD method may be used.

Next, treatment for adding an oxygen 431 (oxygen doping treatment) is performed on the oxide insulating film 480 having the projecting portion on its surface, so that an oxygen-excess region 481 is formed in the vicinity of the bottom surface of the oxide insulating film 480 and in the vicinity of the conductive layer 491. Thus, an oxide insulating film 484 having the oxygen-excess region 481 is formed (see FIG. 1B). Note that in the drawing, the oxygen-excess region 481 is illustrated by a dotted line, and the dotted line schematically indicates a center of distribution of the added oxygen.

At least any of an oxygen radical, an oxygen atom, an oxygen molecule, ozone, an oxygen ion (an oxygen molecular ion) and/or an oxygen cluster ion may be included in the oxygen 431.

Introducing the oxygen 431 into the oxide insulating film 480 can be performed by, for example, an ion implantation method, an ion doping method, a plasma immersion ion implantation method, plasma treatment, or the like. Note that as an ion implantation method, a gas cluster ion beam may be used. The oxygen 431 may be introduced into the entire surface of the substrate 400 at a time. Alternatively, a linear ion beam may be used, for example. In the case of using a linear ion beam, relative movement (scanning) of the substrate or the ion beam enables the oxygen 431 to be introduced into the entire surface of the oxide insulating film 480.

As a supply gas of the oxygen 431, a gas containing oxygen (O) can be used; for example, an $O_2$ gas, an $N_2O$ gas, a $CO_2$ gas, a CO gas, or an $NO_2$ gas can be used. Note that a rare gas (e.g., an Ar gas) may be contained in the supply gas of the oxygen.

In the case where oxygen is added by an ion implantation method, the dose of the oxygen 431 is preferably $0.5 \times 10^{16}$ $cm^{-2}$ or higher and $5 \times 10^{16}$ $cm^{-2}$ or lower (e.g., $1 \times 10^{16}$ ions/$cm^2$), and the acceleration energy is preferably 50 eV or higher and 70 eV or lower (e.g., 50 eV). The oxygen content in an oxide insulating film including the oxygen-excess region 481 on which the oxygen doping treatment has been performed is preferably higher than that in the stoichiometric composition of the oxide insulating film. Such a region containing oxygen in excess of the stoichiometric composition preferably exists in the oxygen-excess region 481. The depth at which the oxygen 431 is implanted may be adjusted as appropriate by implantation conditions.

Next, planarization treatment is performed on the oxide insulating film 484 including the oxygen-excess region 481 so that the projecting portion of the top surface of the oxide insulating film 484 is removed. The oxide insulating film 484 over the conductive layer 491 is selectively removed, so that the surface of the oxide insulating film 480 is planarized. Accordingly, the planarized oxide insulating film 436 is formed (see FIG. 1C).

By the planarization treatment, the oxide insulating film over the conductive layer 491 is selectively removed to be thin, whereby the distance between the oxygen-excess region 481 over the conductive layer 491 and the top surface of the oxide insulating film becomes shorter. In contrast, a region of the oxide insulating film, which is not over the conductive layer 491, is hardly removed, and the oxygen-excess region 481 exists in the vicinity of the bottom surface of the oxide insulating film. Thus, in the oxide insulating film 436, the oxygen-excess region 481 is provided at a shallow position from the top surface of the oxide insulating film in the region which is over the conductive layer 491 and is provided at a deep position from the top surface of the oxide insulating film in another region (the region which is not over the conductive layer 491).

This means that in part of the oxide insulating film 436 over which the oxide semiconductor film is provided in a later step and which overlaps with the conductive layer 491, the oxygen-excess region 481 can be provided close to the oxide semiconductor film provided; thus, oxygen can be efficiently supplied from the oxygen-excess region 481 to the oxide semiconductor film. Supply of oxygen can be promoted by heat treatment.

In the oxide insulating film 436, the oxygen-excess region 481 is provided far from the top surface of the oxide insulating film 436 in a region other than the region below the oxide semiconductor film to which oxygen is required to be supplied, that is, in the vicinity of the bottom surface of the oxide insulating film 436. Thus, in the case where heat treatment is performed, in particular, unnecessary release of oxygen from the top surface of the oxide insulating film 436 can be suppressed, and the oxide insulating film 436 can be kept in an oxygen excess state.

The introduction of the oxygen 431 to the oxide insulating film 480 is described as an example in this embodiment; however, the introduction of the oxygen 431 to the oxide insulating film 480 can be omitted as long as the oxide insulating film 480 contains sufficient oxygen shortly after the formation.

The planarization treatment may be, but not particularly limited to, polishing treatment (such as chemical mechanical polishing (CMP)), dry etching treatment, or plasma treatment.

Next, an oxide semiconductor film 403 is formed over the oxide insulating film 436. As a material of the oxide semiconductor film 403, for example, the following can be used: a two-component metal oxide such as an In—Zn-based oxide, an In—Mg-based oxide, or an In—Ga-based oxide, a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Sn—Al—Zn-based oxide, or an In—Sn—Hf—Zn-based oxide.

Note that here, for example, an In—Ga—Zn-based oxide means an oxide containing In, Ga, and Zn, and there is no limitation on the composition ratio of In, Ga, and Zn. Further, the In—Ga—Zn-based oxide semiconductor may contain a metal element other than In, Ga, and Zn.

In this embodiment, as a target for forming the oxide semiconductor film 403 by a sputtering method, an oxide target containing In, Ga, and Zn at an atomic ratio of 3:1:2 is used to form an In—Ga—Zn-based oxide film (IGZO film) having a thickness of 5 nm or greater and 30 nm or less.

It is particularly preferable that the oxide semiconductor film 403 be a CAAC-OS film. In the case where a CAAC-OS film is used, part of the oxide semiconductor film 403 (region overlapping with the conductive layer 491 and serving as a channel formation region) can be thinned in a later step (by wet etching), and the oxide semiconductor film 403 can have a cross-sectional shape in which the thickness of a boundary region between a thin region and a thick region (region overlapping with a metal film) increases and the boundary region has a smooth forward tapered slope. In the oxide semiconductor film 403, the thickness of the thin region is at least smaller than that of the thick region and larger than the half thickness of the thick region.

The relative density (filling factor) of the metal oxide target is greater than or equal to 90% and less than or equal to 100%, preferably greater than or equal to 95% and less than or equal to 99.9%. With use of the metal oxide target with high filling factor, a dense oxide semiconductor film can be formed.

It is preferable that a high-purity gas from which impurities such as hydrogen, water, a hydroxyl group, and hydride are removed be used as a sputtering gas for the formation of the oxide semiconductor film 403.

The substrate is held in a deposition chamber kept under reduced pressure. Then, a sputtering gas in which hydrogen and moisture are removed is introduced into the deposition chamber from which remaining moisture is being removed, so that the oxide semiconductor film 403 is formed over the oxide insulating film 436 with the use of the target. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition chamber can be reduced.

The oxide semiconductor film 403 can be formed by processing a film-shaped oxide semiconductor film into an island shape by a photolithography process.

A resist mask for forming the island-shaped oxide semiconductor film 403 may be formed by an inkjet method. Formation of the resist mask by an inkjet method needs no photomask; thus, manufacturing cost can be reduced.

Heat treatment may be performed in order to promote supply of oxygen from the oxide insulating film 436 to the oxide semiconductor film 403.

Next, a source electrode layer 405a and a drain electrode layer 405b which are electrically connected to the oxide semiconductor film 403 are formed. A variety of circuits can be formed by electrical connection with another transistor or element with the use of the source electrode layer 405a and the drain electrode layer 405b.

The source electrode layer 405a and the drain electrode layer 405b can be formed in such a manner that a conductive film is formed by a sputtering method, an evaporation method, or the like and then is processed by an etching method.

As the conductive film used for the source electrode layer 405a and the drain electrode layer 405b, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used.

In this embodiment, a single-layer tungsten film is used, a resist mask is formed over the tungsten film, first etching is performed to remove the tungsten film to approximately half the thickness so that the tungsten film partly has a small thickness, and ashing (e.g., $O_2$ ashing) is performed on the resist mask for reducing the area of the resist mask. After that, second etching is performed with the resist mask, which is reduced in size, so that the source electrode layer 405a and the drain electrode layer 405b each including a projecting portion when seen in cross-section as illustrated in FIG. 1D are formed.

Subsequently, the resist mask, which is reduced in size, is removed. A cross-sectional view at this stage corresponds to FIG. 1D.

Next, the oxide semiconductor film 403 is subjected to wet etching using dilute hydrofluoric acid (concentration: 0.0025%). The concentration of dilute hydrofluoric acid, the processing time of wet etching, the degree of crystallinity of the oxide semiconductor film 403, and the like are controlled as appropriate to form the thin region in the oxide semiconductor film 403. By wet etching using dilute hydrofluoric acid, the thickness of the oxide semiconductor film in the channel formation region can be controlled more accurately and contaminants in the vicinity of the channel formation region can be reduced. Thus, the performance of the transistor can be improved.

Further, the formation of the thin region in the oxide semiconductor film 403 can reduce the electric field concentration which might occur between the source electrode layer 405a and the drain electrode layer 405b.

In this embodiment, a process is described as an example in which after the tungsten film is processed, the oxide semiconductor film 403 is subjected to wet etching using dilute hydrofluoric acid to form the thin region. However, one embodiment of the present invention is not limited thereto and etching conditions for processing the tungsten film can be adjusted as appropriate so that the thin region may be formed in the oxide semiconductor film 403.

Wet etching is performed only on the exposed portion of oxide semiconductor film 403 using the source electrode layer 405a including a projecting portion and the drain electrode layer 405b including a projecting portion as masks.

In this embodiment, the exposed portion of the oxide semiconductor film 403 is etched approximately 5 nm (the film is thinned by approximately 5 nm), for example. In that case, the optimal processing time of wet etching may be calculated from the etching rate as appropriate.

Figure 1C:
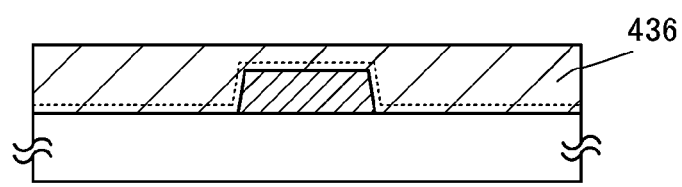
Figure 1D:
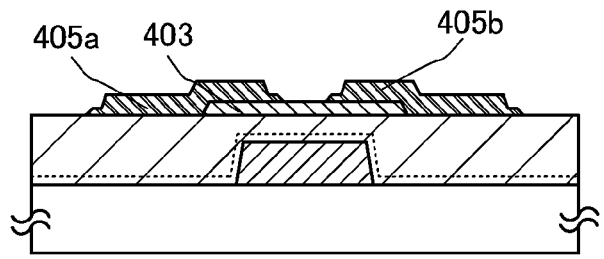
Figure 1E:
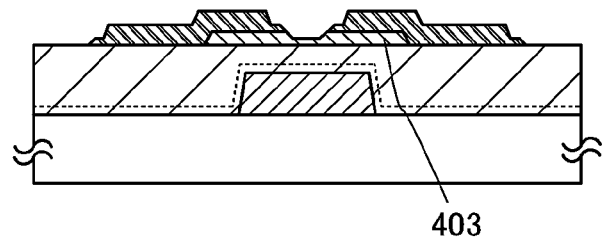

When the oxide semiconductor film 403 is subjected to wet etching using the source electrode layer 405a and the drain electrode layer 405b as masks, the thickness of the oxide semiconductor film 403 in a region not overlapping with the source electrode layer 405a nor the drain electrode layer 405b becomes smaller than that of the oxide semiconductor film 403 in a region overlapping with the source electrode layer 405a or the drain electrode layer 405b (see FIG. 1E). This thin region can serve as the channel formation region of the transistor. Accordingly, the distance between adjacent lower edge portions of the source electrode layer 405a and the drain electrode layer 405b extending in the channel length direction and overlapping with the conductive layer 491 can be a channel length.

To prevent a surface of the oxide insulating film 436 in contact with the oxide semiconductor film 403 from being exposed, the oxide semiconductor film 403 should not be overetched when the thin region is formed. For that reason, the concentration of dilute hydrofluoric acid, the processing time of wet etching, the degree of crystallinity of the oxide semiconductor film 403, and the like are preferably controlled as appropriate.

After that, pure water megasonic cleaning is performed. A cross-sectional view at this stage corresponds to FIG. 1E.

As the oxide semiconductor film subjected to wet etching using dilute hydrofluoric acid as described above, an oxide semiconductor film having a crystal structure, in particular, a CAAC-OS film is preferably used because the following effects become conspicuous: an effect of improving the coverage with a gate insulating film and a gate electrode layer to be formed over the CAAC-OS film, an effect of improving the performance of the transistor, an effect of preventing degradation of the electrical characteristics of the transistor, and the like.

The CAAC-OS film is easily etched anisotropically as compared with, for example, an oxide semiconductor film whose whole or most part is amorphous (also referred to as an amorphous OS film). Since the etching rate of each crystal plane in a crystal structure in the CAAC-OS film differs from one another, the CAAC-OS film can be etched anisotropically utilizing the difference between the etching rates.

Thus, the CAAC-OS film can have a cross-sectional shape in which the thickness of a boundary region between a thin region (region not overlapping with the source electrode layer 405a nor the drain electrode layer 405b) and a thick region (region overlapping with the source electrode layer 405a or the drain electrode layer 405b) increases and the boundary region has a smooth forward tapered slope.

Further, the coverage with the gate insulating film can be improved even when the gate insulating film has a small thickness. In addition, electric field concentration at the boundary region between the thin region and the thick region in the CAAC-OS film can be reduced to improve the reliability of the transistor.

The amorphous OS film, on the other hand, is easily etched isotropically. In isotropic etching, the amorphous OS film is etched also in the lateral direction at the same rate as the downward etching; as a result, parts of the amorphous OS film under the source electrode layer 405a including a projecting portion and the drain electrode layer 405b including a projecting portion used as masks are also removed. Thus, the coverage with a gate insulating film and a gate electrode layer to be formed over the amorphous OS film is reduced.

Figure 1F:
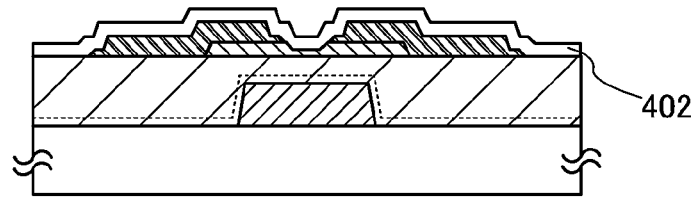

Next, a gate insulating film 402 is formed to cover the oxide semiconductor film 403, the source electrode layer 405a, and the drain electrode layer 405b (see FIG. 1F).

The gate insulating film 402 has a thickness greater than or equal to 1 nm and less than or equal to 20 nm, for example, and can be formed by a sputtering method, an MBE method, a CVD method, a pulsed laser deposition method, an ALD method, or the like as appropriate. The gate insulating film 402 may be formed with a sputtering apparatus which performs film deposition on surfaces of a plurality of substrates set substantially perpendicular to a surface of a sputtering target.

As the gate insulating film 402, a silicon oxide film, a gallium oxide film, a $Ga_2O_3$ $(Gd_2O_3)$ film, a zinc oxide film, an aluminum oxide film, a silicon nitride film, a silicon oxynitride film, an aluminum oxynitride film, or a silicon nitride oxide film can be used. An In—Ga—Zn-based oxide film having an insulating property can also be used as the gate insulating film 402. The In—Ga—Zn-based oxide film having an insulating property may be formed under the following conditions: an oxide target containing In, Ga, and Zn in an atomic ratio of 1:3:2 is used, the substrate temperature is room temperature, and a sputtering gas is an argon gas or a mixed gas of argon and oxygen.

In this embodiment, a gallium oxide film formed by a sputtering method is used as the gate insulating film 402. Since the gate insulating film 402 formed using gallium oxide contains the same constituent material as that of the oxide semiconductor film 403, the interface state between the oxide semiconductor film 403 and the gate insulating film 402 can be excellent, which gives stable electrical characteristics.

Next, a conductive film is formed over the gate insulating film 402 by a sputtering method, an evaporation method, or the like. The conductive film is etched so that gate electrode layers 401a and 401b are formed.

The gate electrode layers 401a and 401b can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layers 401a and 401b. The gate electrode layers 401a and 401b may have a single-layer structure or a stacked-layer structure.

In this embodiment, a metal oxide film containing nitrogen (an In—Ga—Zn-based oxide film containing nitrogen) is used as the gate electrode layer 401a over and in contact with the gate insulating film 402, and a tungsten film is formed over the gate electrode layer 401a as the gate electrode layer 401b. The use of the metal oxide film containing nitrogen as the gate electrode layer 401a enables the transistor to have a positive threshold voltage.

Figure 2A:
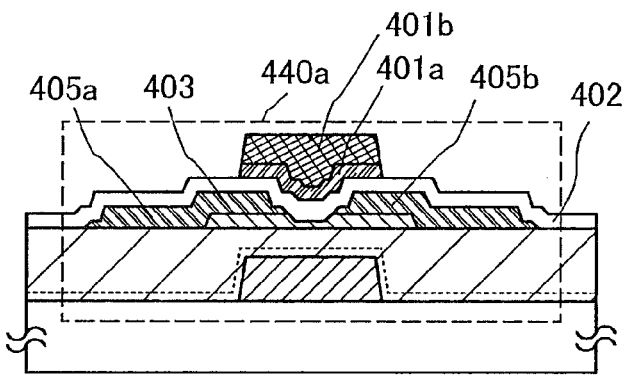
FIGS. 2A to 2C are cross-sectional views illustrating manufacturing steps of one embodiment of the present invention.

Through the above steps, a transistor 440a of this embodiment can be manufactured (see FIG. 2A). The transistor 440a is an example of a top-gate transistor. FIG. 2A is a cross-sectional view of the transistor 440a in the channel length direction.

The conductive layer 491 provided in the oxide insulating film 436 including the oxygen-excess region 481 overlaps with the gate electrode layers 401a and 401b with a channel formation region positioned therebetween, and controls the electrical characteristics of the transistor 440a.

The conductive layer 491 serves as a second gate electrode layer (what we call a back gate) which controls the electrical characteristics of the transistor 440a. For example, by setting the potential of the conductive layer 491 to GND (or a fixed potential), the threshold voltage of the transistor 440a is increased, so that the transistor 440a can be normally off.

The gate electrode layers 401a and 401b overlap with part of the source electrode layer 405a and part of the drain electrode layer 405b. Since some of the projecting portion of the source electrode layer 405a and the drain electrode layer 405b have shapes with which coverage with the gate insulating film 402 can be improved, electric-field concentration is reduced. This contributes to improvement in the electrical characteristics and reliability of the transistor.

Figure 2B:
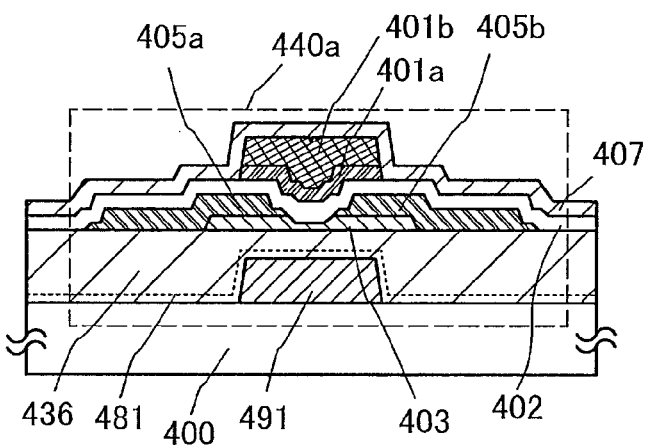

Next, an insulating film 407 covering the gate electrode layers 401a and 401b is formed (see FIG. 2B). The insulating film 407 functions as a barrier film (protective film) having a high property of preventing oxygen from being released from the oxide semiconductor film 403 or the gate insulating film 402.

The insulating film 407 functioning as a barrier film is preferably a fine film which can prevent impurities such as hydrogen and moisture from entering the oxide semiconductor film 403.

As the insulating film 407 functioning as a barrier film, for example, an inorganic insulating film such as a gallium oxide film, a $Ga_2O_3$ ($Gd_2O_3$) film, a silicon oxide film, a silicon oxynitride film, an aluminum oxide film, an aluminum oxynitride film, a silicon nitride film, an aluminum nitride film, a silicon nitride oxide film, an aluminum nitride oxide film, or a zinc oxide film can be used. The insulating film 407 may have a single layer or a stack of layers. The insulating film 407 functioning as a barrier film can be formed by a plasma CVD method, a sputtering method, a CVD method using a deposition gas, or an MBE method.

Next, an interlayer insulating film 485 is formed over the insulating film 407. The interlayer insulating film 485 may be a single layer or a stack of layers, and an inorganic insulating film such as a silicon oxide film, a silicon oxynitride film, an aluminum oxide film, an aluminum oxynitride film, a silicon nitride film, an aluminum nitride film, a silicon nitride oxide film, an aluminum nitride oxide film, or a gallium oxide film can be used.

Figure 2C:
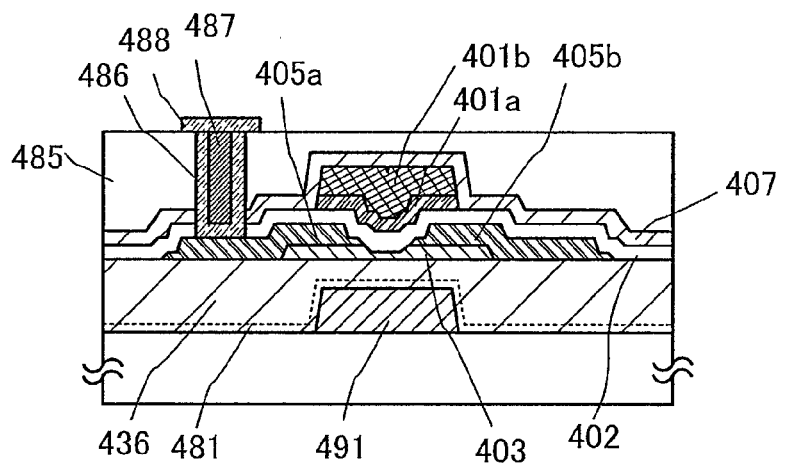

FIG. 2C is a cross-sectional view illustrating the steps up to and including a step of forming an embedded wiring in the interlayer insulating film 485. A contact hole reaching the source electrode layer 405a is formed in the interlayer insulating film 485, a first barrier metal film 486 is formed, and a copper film or a copper alloy film is formed thereover so as to form a low-resistance conductive layer 487. Then, polishing is performed for planarization, and a second barrier metal film 488 is formed so as to protect the exposed low-resistance conductive layer 487. The embedded wiring includes the first barrier metal film 486, the second barrier metal film 488, and the low-resistance conductive layer 487 surrounded by the first barrier metal film 486 and the second barrier metal film 488.

Each of the first barrier metal film 486 and the second barrier metal film 488 may be formed using a conductive material which suppresses diffusion of copper contained in the low-resistance conductive layer 487. Examples of the conductive material are a tantalum nitride film, a molybdenum nitride film, and a tungsten nitride film.

Through the above steps, a semiconductor device having a multilayer structure in which another semiconductor element, another wiring, or the like is formed over the transistor 440a can be manufactured. The semiconductor element, the wiring, or the like which is provided over the transistor 440a can be electrically connected to the embedded wiring.

The cross-sectional structure of the transistor 440a described in this embodiment is merely an example, and is not limited as long as the cross-sectional shape of the oxide semiconductor film 403 (preferably, also the cross-sectional shapes of the source electrode layer 405a and the drain electrode layer 405b) is the same as that in this embodiment. Although the transistor 440a is a MOSFET here, an insulated gate bipolar transistor (IGBT), a metal semiconductor field effect transistor (MESFET), or the like can be used as the transistor 440a. In the case where an IGBT is used as the transistor 440a, a source electrode layer corresponds to an emitter terminal and a drain electrode layer corresponds to a collector terminal Examples of cross-sectional structures of other transistors are given below.

Figure 3A:
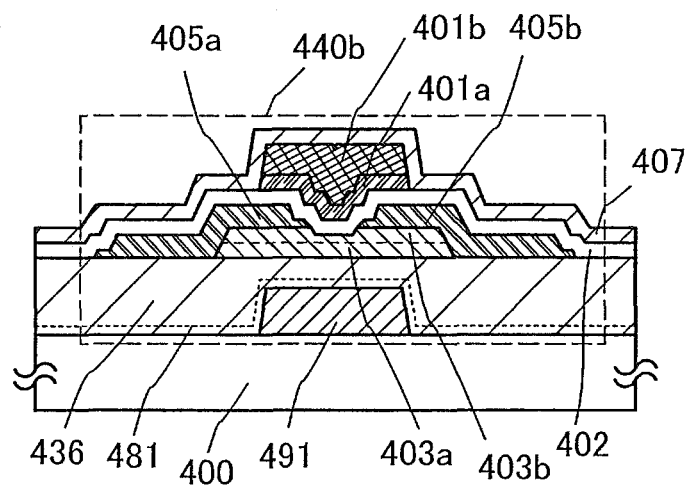
FIGS. 3A to 3C are cross-sectional views each illustrating one embodiment of the present invention.

A transistor 440b illustrated in FIG. 3A has a two-layer structure in which a second oxide semiconductor film 403b is stacked over a first oxide semiconductor film 403a. The composition of the second oxide semiconductor film 403b is different from that of the first oxide semiconductor film 403a. The second oxide semiconductor film 403b includes a thin region. The structure in FIG. 3A is the same as that in FIG. 2B except the transistor 440b has a two-layer structure. Thus, detailed description thereof is omitted here.

As the first oxide semiconductor film 403a, an In—Ga—Zn-based oxide film formed with a target containing In, Ga, and Zn at an atomic ratio of 3:1:2 is used. The first oxide semiconductor film 403a preferably contains more In than Ga and Zn in an atomic ratio. As the second oxide semiconductor film 403b, an In—Ga—Zn-based oxide film formed with a target containing In, Ga, and Zn at an atomic ratio of 1:1:1 is used.

In the case where a stack of oxide semiconductor films having different compositions is used, the thin region in the second oxide semiconductor film 403b is formed so that the first oxide semiconductor film 403a is not exposed.

An In—Ga—Zn-based oxide film formed with a target containing In, Ga, and Zn at an atomic ratio of 3:1:2 is used for a channel formation region of the transistor 440b in FIG. 3A, and thus field-effect mobility can be improved.

Figure 3B:
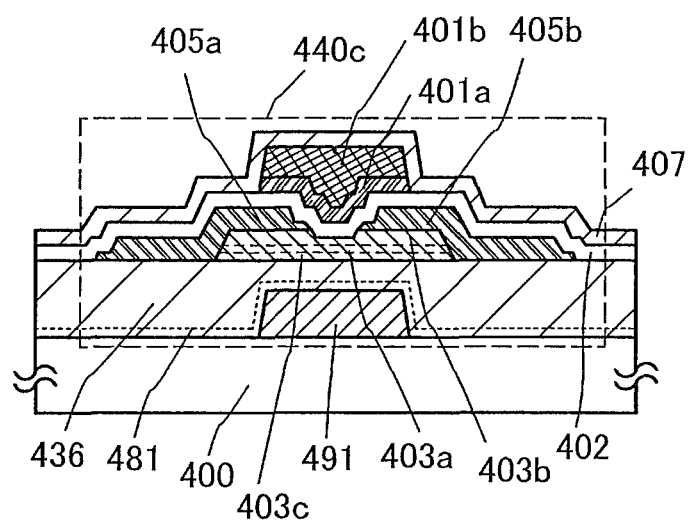

A transistor 440c illustrated in FIG. 3B has a three-layer structure in which the first oxide semiconductor film 403a is stacked over a third oxide semiconductor film 403c and the second oxide semiconductor film 403b is stacked over the first oxide semiconductor film 403a. The compositions of the second and third oxide semiconductor films 403b and 403c are different from the composition of the first oxide semiconductor film 403a. The second oxide semiconductor film 403b includes a thin region. The structure in FIG. 3B is the same as that in FIG. 2B except the transistor 440b has a three-layer structure. Thus, detailed description thereof is omitted here.

As the first oxide semiconductor film 403a, an In—Ga—Zn-based oxide film formed with a target containing In, Ga, and Zn at an atomic ratio of 3:1:2 is used. The first oxide semiconductor film 403a preferably contains more In than Ga and Zn in an atomic ratio. As the second oxide semiconductor film 403b, an In—Ga—Zn-based oxide film formed with a target containing In, Ga, and Zn at an atomic ratio of 1:1:1 or 1:3:2 may used. As the third oxide semiconductor film 403c, an In—Ga—Zn-based oxide film formed with a target containing In, Ga, and Zn at an atomic ratio of 1:3:2 or 1:1:1 may used.

In the case where a stack of oxide semiconductor films having different compositions is used, the thin region in the second oxide semiconductor film 403b is formed so that the first oxide semiconductor film 403a is not exposed.

An In—Ga—Zn-based oxide film formed with a target containing In, Ga, and Zn at an atomic ratio of 3:1:2 is used for a channel formation region of the transistor 440c in FIG. 3B, and thus field-effect mobility can be improved.

Figure 3C:
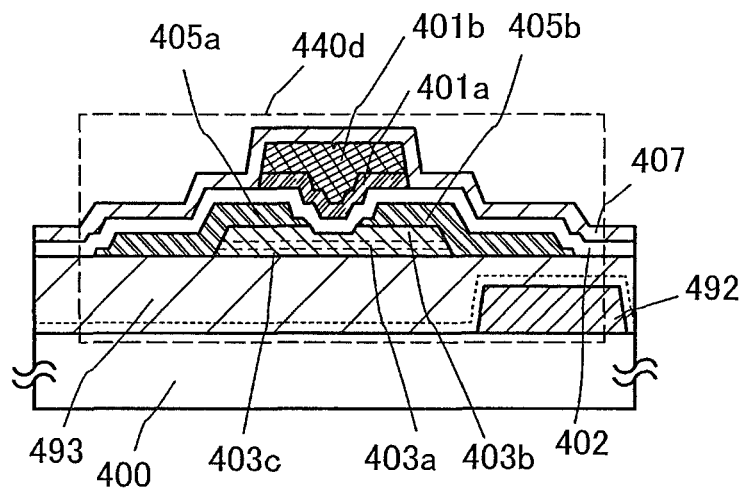

A transistor 440d in FIG. 3C is an example in which a conductive layer 492 is provided so as not to overlap with a channel formation region. Since the structure in FIG. 3C is the same as that in FIG. 3B except the conductive layer 492 is provided so as not to overlap with the channel formation region, the detailed description is omitted here.

In the case where the threshold voltage of the transistor 440d is increased and the transistor 440d is a normally-off transistor shortly after the formation thereof, the conductive layer 492 does not necessarily overlap with the channel formation region as illustrated in FIG. 3C. In the case where the transistor 440d is not required to be a normally-off transistor depending on the circuit configuration, only the transistor can be used as a normally-on transistor.

The structures of the transistors illustrated in FIG. 2B and FIGS. 3A to 3C are partly different from one another; however, the present invention is not limited to these structures, and a variety of combinations are possible.

(Embodiment 2)

In this embodiment, an example of a method for manufacturing a transistor is described below; the method allows reduction in parasitic capacitance that is formed among a gate electrode layer, a gate insulating film, and a source electrode layer which overlaps with the gate electrode layer with the gate insulating film provided therebetween and parasitic capacitance that is formed among the gate electrode layer, the gate insulating film, and a drain electrode layer which overlaps with the gate electrode layer with the gate insulating film provided therebetween. Part of steps in a manufacturing process is the same as that in Embodiment 1, and thus the detailed description of the part of the steps is omitted.

First, steps up to and including the step in FIG. 1C, which is described in Embodiment 1, are performed. That is, the conductive layer 491 is formed over the substrate 400, and the oxide insulating film 436 including the oxygen-excess region 481 is formed. A cross-sectional view at this stage is shown in FIG. 4A. Note that FIG. 4A is the same as FIG. 1C.

Then, the first oxide semiconductor film 403a is formed over the oxide insulating film 436, and the second oxide semiconductor film 403b is formed over the first oxide semiconductor film 403a. The first oxide semiconductor film 403a and the second oxide semiconductor film 403b are successively formed without exposure to the air.

As the first oxide semiconductor film 403a, an In—Ga—Zn-based oxide film formed with a target containing In, Ga, and Zn at an atomic ratio of 3:1:2 is used. The first oxide semiconductor film 403a contains more In than Ga and Zn in an atomic ratio. As the second oxide semiconductor film 403b, an In—Ga—Zn-based oxide film formed with a target containing In, Ga, and Zn at an atomic ratio of 1:1:1 is used. Each of the first oxide semiconductor film 403a and the second oxide semiconductor film 403b is an oxide film having a crystal structure, preferably, a CAAC-OS film.

Next, the oxide semiconductor films are processed into island-shaped oxide semiconductor films by a photolithography process. After that, a conductive film is formed by a sputtering method, an evaporation method, or the like.

Next, resist masks 408a and 408b are formed over the conductive film, and etching is performed to remove the conductive film to approximately half the thickness so that the conductive film partly has a small thickness. Thus, a conductive film 406 which partly has a small thickness is formed. A cross-sectional view at this stage is illustrated in FIG. 4B.

Subsequently, the resist masks 408a and 408b are removed and then, a protective layer 409 is formed over the conductive film 406 which partly has a small thickness (see FIG. 4C). This protective layer 409 is provided to protect part of the conductive film in later etching of the gate insulating film 402. This protective layer 409 is formed using a silicon oxide film, a silicon oxynitride film, an aluminum oxide film, an aluminum oxynitride film, a silicon nitride film, an aluminum nitride film, a silicon nitride oxide film, an aluminum nitride oxide film, or the like. Note that is preferable that the protective layer 409 be formed using a material different from that of the gate insulating film 402 and etching selectivity of the gate insulating film 402 to the protective layer 409 be high. In this embodiment, a silicon oxide film formed by a sputtering method is used.

Next, a resist mask is formed over the protective layer 409, and then the source electrode layer 405a and the drain electrode layer 405b each including a projecting portion when seen in cross-section as illustrated in FIG. 4D are formed. In the formation of the source electrode layer 405a and the drain electrode layer 405b, the protective layer 409 is also etched, and a first protective layer 410a which overlaps with and is in contact with the source electrode layer 405a and a second protective layer 410b which overlaps with and is in contact with the drain electrode layer 405b are formed. A cross-sectional view at the stage in which the resist mask is removed is illustrated in FIG. 4D.

Next, the oxide semiconductor film 403 is subjected to wet etching using dilute hydrofluoric acid (concentration: 0.0025%) to form the thin region in the oxide semiconductor film which is a CAAC-OS film (here, the second oxide semiconductor film 403b). By wet etching using dilute hydrofluoric acid, the thickness of the oxide semiconductor film in the channel formation region can be controlled more accurately and contaminants in the vicinity of the channel formation region can be reduced. Thus, the performance of the transistor can be improved.

After that, pure water megasonic cleaning is performed. A cross-sectional view at this stage corresponds to FIG. 4E.

Then, the gate insulating film 402 covering the second oxide semiconductor film 403b, the first protective layer 410a, and the second protective layer 410b is formed. As a material of the gate insulating film 402, a film containing gallium oxide, typified by a gallium oxide film, is used in this embodiment. Even in the case where the film containing gallium oxide has a small thickness such as 20 nm or smaller, the film prevents impurities such as nitrogen from entering the oxide semiconductor film provided below the film when or after a metal oxide film containing nitrogen is formed by a sputtering method or the like in a later step.

Next, a conductive film is formed over the gate insulating film 402 by a sputtering method, an evaporation method, or the like. The conductive film is etched so that the gate electrode layers 401a and 401b are formed. Next, part of the gate insulating film 402 is removed with the use of the gate electrode layers 401a and 401b as masks. When part of the gate insulating film 402 is removed, the first protective layer 410a and the second protective layer 410b function as etching stoppers, that is, protect the source electrode layer 405a and the drain electrode layer 405b from etching treatment.

In this embodiment, a metal oxide film containing nitrogen (an In—Ga—Zn-based oxide film containing nitrogen) is used as the gate electrode layer 401a over and in contact with the gate insulating film 402, and a tungsten film is formed over the metal oxide as the gate electrode layer 401b.

Through the above steps, a transistor 441a of this embodiment can be manufactured. Lastly, the insulating film 407 is formed so that the insulating film 407 covers the gate electrode layers 401a and 401b and is in contact with the first protective layer 410a and the second protective layer 410b (see FIG. 4F). The insulating film 407 functions as a bather film having a high property of preventing oxygen from being released from the first oxide semiconductor film 403a, the second oxide semiconductor film 403b, or the gate insulating film 402. The transistor 441a is an example of a top-gate transistor. FIG. 4F is a cross-sectional view of the transistor 441a in the channel length direction.

In the transistor 441a in FIG. 4F, even though the gate electrode layers 401a and 401b overlap with part of the source electrode layer 405a and part of the drain electrode layer 405b, since the first protective layer 410a and the second protective layer 410b are provided over and in contact with the source electrode layer 405a and the drain electrode layer 405b, respectively, parasitic capacitance of this portion is smaller than that of the transistor 440a in Embodiment 1.

The cross-sectional structure of the transistor 441a described in this embodiment is merely an example. The cross-sectional structure is not limited as long as the cross-sectional shape of the oxide semiconductor film 403 (preferably, also the cross-sectional shapes of the source electrode layer 405a and the drain electrode layer 405b) is the same as that in this embodiment. An example of a cross-sectional structure of another transistor is given below.

Figure 5A:
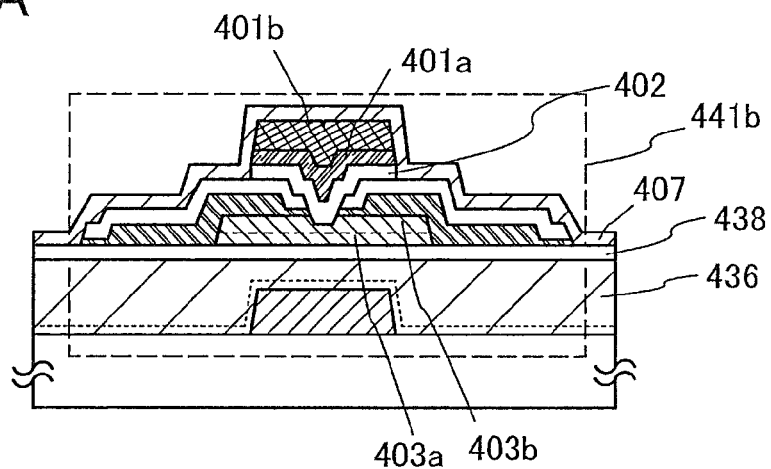
FIGS. 5A to 5C are cross-sectional views each illustrating one embodiment of the present invention.

A transistor 441b in FIG. 5A is an example in which an insulating film 438 containing gallium oxide is provided between the oxide insulating film 436 and the first oxide semiconductor film 403a.

The transistor 441b in FIG. 5A includes the insulating film 438 containing gallium oxide in contact with bottom surfaces of the source electrode layer 405a and the drain electrode layer 405b. The insulating film 438 containing gallium oxide functions as an etching stopper for protecting the oxide insulating film 436 in etching of the gate insulating film 402. The insulating film 407 is in contact with the insulating film 438 containing gallium oxide in the periphery region of the transistor.

The structure in FIG. 5A is the same as that in FIG. 4F except the insulating film 438 containing gallium oxide is provided between the oxide insulating film 436 and the first oxide semiconductor film 403a. Thus, detailed description thereof is omitted here.

Figure 5B:
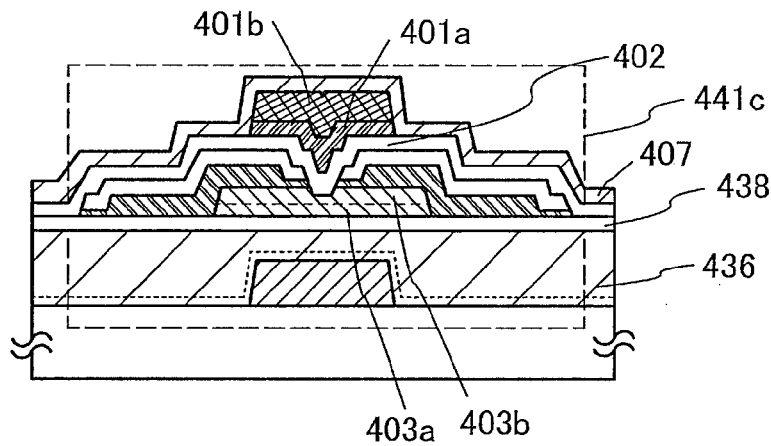

A transistor 441c in FIG. 5B includes the insulating film 438 containing gallium oxide which is provided between the oxide insulating film 436 and the first oxide semiconductor film 403a and is partly in contact with the gate insulating film 402. The transistor in FIG. 5B has the same structure as that in FIG. 5A except for the top shape of the gate insulating film 402. Thus, detailed description thereof is omitted here.

In the transistor 441c, since the gate insulating film 402 contains gallium oxide, the first oxide semiconductor film 403a, the second oxide semiconductor film 403b, the source electrode layer 405a, and the drain electrode layer 405b are covered with insulating films containing gallium oxide. Thus, oxygen is prevented from being released all around from the stack of oxide semiconductor films.

Figure 5C:
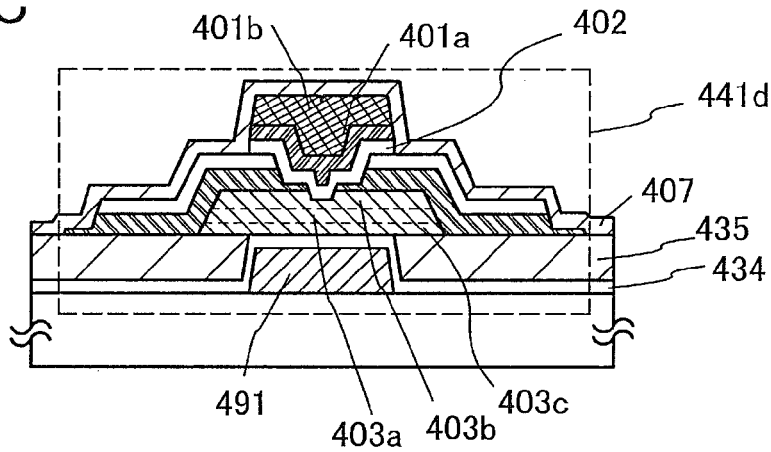

A transistor 441d in FIG. 5C is an example in which an oxide semiconductor film has a three-layer structure: the first oxide semiconductor film 403a is stacked over the third oxide semiconductor film 403c and the second oxide semiconductor film 403b is stacked over the first oxide semiconductor film 403a. The compositions of the first to third oxide semiconductor films 403a to 403c are different from one another. The second oxide semiconductor film 403b includes a thin region.

In the transistor 441d, an insulating film 434 covering the conductive layer 491 is formed and an oxide insulating film 435 is polished so that part of the insulating film 434 is exposed.

The insulating film 434 is a barrier film, and is formed using an inorganic insulating film such as an aluminum oxide film, an aluminum oxynitride film, a silicon nitride film, an aluminum nitride film, a silicon nitride oxide film, an aluminum nitride oxide film, or a gallium oxide film.

The insulating film 434 is a silicon oxide film or a silicon oxynitride film obtained by a plasma CVD method.

The transistor 441d in FIG. 5C has the same structure as that in FIG. 5A except the oxide semiconductor film has a three-layer structure, the insulating film 434 is provided, and oxygen doping treatment is not performed. Thus, detailed description thereof is omitted here.

Figure 6A:
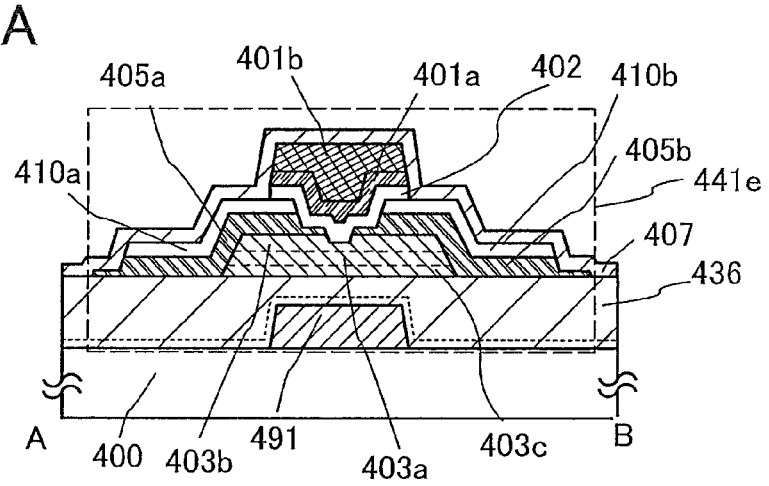
FIGS. 6A and 6B are a cross-sectional view and a top view illustrating one embodiment of the present invention.

A transistor 441e in FIG. 6A has the same structure as that in FIG. 5A except the oxide semiconductor film has a three-layer structure. Thus, detailed description thereof is omitted here.

Figure 6B:
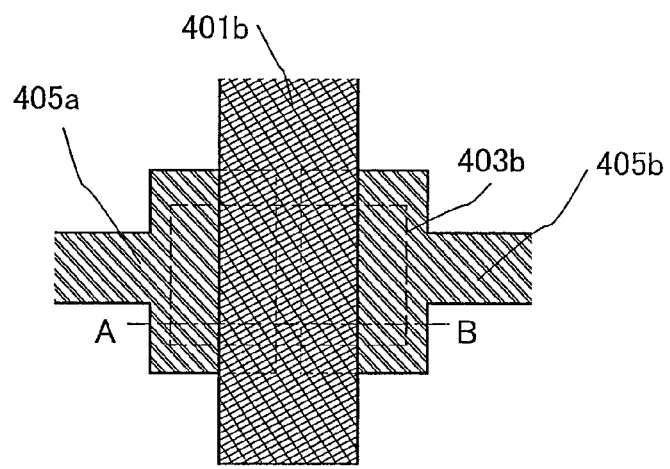

FIG. 6B illustrates an example of a top view of the transistor 441e. A cross-sectional view taken along a chain line A-B in FIG. 6B corresponds to FIG. 6A. As illustrated in FIG. 6B, the source electrode layer 405a or the drain electrode layer 405b covers the periphery of the second oxide semiconductor film 403b, and the gate electrode layer 401b covers a region of the second oxide semiconductor film 403b which is not covered with the source electrode layer 405a or the drain electrode layer 405b. Thus, the second oxide semiconductor film 403b is not exposed in etching of the gate electrode layer 401b. As illustrated in FIG. 6A, the top surface of the source electrode layer 405a is covered with the first protective layer 410a and the top surface of the drain electrode layer 405b is covered with the second protective layer 410b; thus, the source electrode layer 405a and the drain electrode layer 405b are not removed in etching of the gate electrode layer 401b.

The structures of the transistors illustrated in FIG. 4F, FIGS. 5A to 5C, and FIG. 6A are partly different from one another; however, the present invention is not limited to these structures, and a variety of combinations are possible.

Further, this embodiment can be freely combined with Embodiment 1.

It is needless to say that in this embodiment, the same reference numerals and the same materials are used for the same parts as those in Embodiment 1.

(Embodiment 3)

In this embodiment, an example of a semiconductor device including the transistors described in Embodiment 1 or 2 is described with reference to FIGS. 7A and 7B.

Figure 7A:
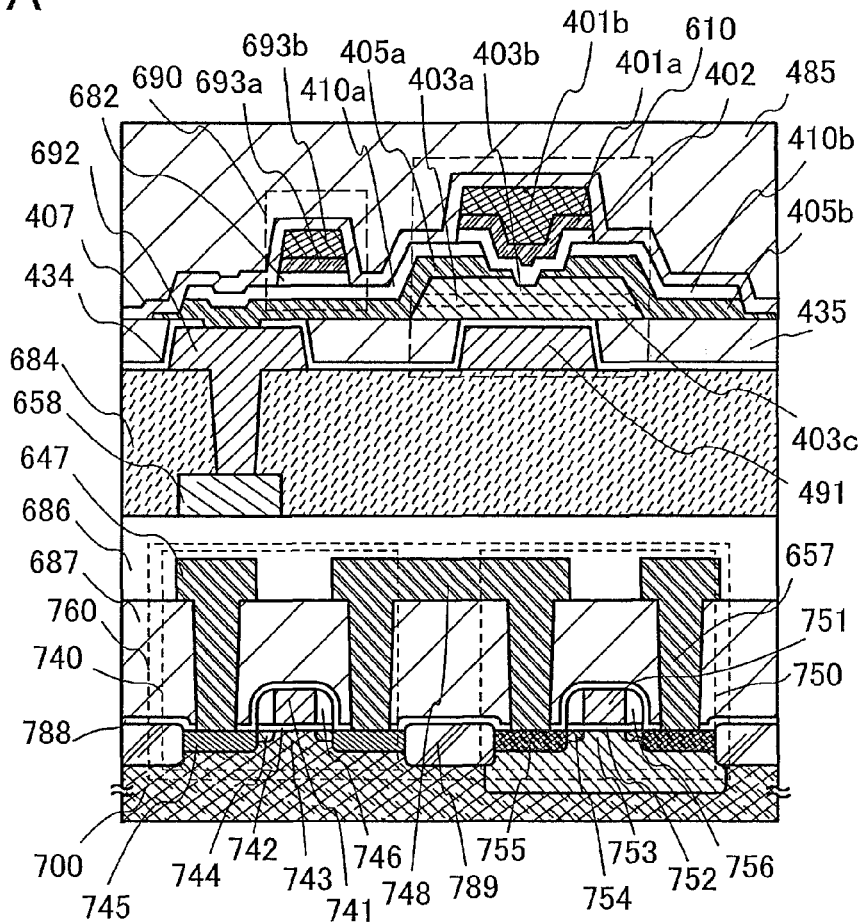
FIGS. 7A and 7B are a cross-sectional view and a circuit diagram illustrating one embodiment of a semiconductor device.
Figure 7B:
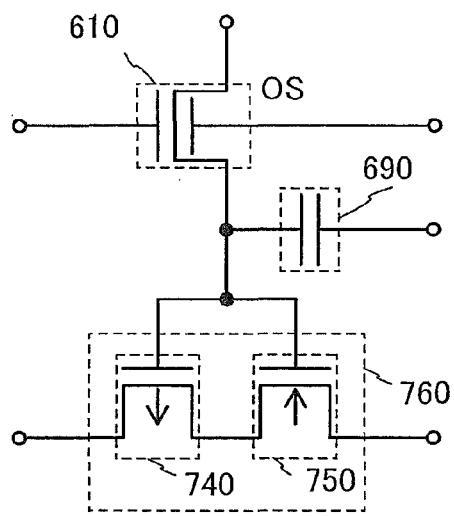

The semiconductor device illustrated in FIGS. 7A and 7B includes transistors 740 and 750 including a first semiconductor material in a lower portion, and a transistor 610 including a second semiconductor material in an upper portion. The transistor 610 has a structure similar to that of the transistor 441d described in Embodiment 2. The same reference numerals are used for the same parts as those in FIG. 5C. FIG. 7B is a circuit diagram of the semiconductor device in FIG. 7A.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material such as silicon can easily operate at high speed. On the other hand, charge can be held in a transistor including an oxide semiconductor for a long time owing to its characteristics.

As a substrate used in the semiconductor device, a single crystal semiconductor substrate or a polycrystalline semiconductor substrate made of silicon or silicon carbide, a compound semiconductor substrate made of silicon germanium or the like, a silicon on insulator (SOI) substrate, or the like can be used. A channel formation region of the transistor can be formed in or over the semiconductor substrate. The semiconductor device in FIG. 7A is an example in which the channel formation region is formed in the semiconductor substrate to form a lower transistor.

In the semiconductor device in FIG. 7A, a single crystal silicon substrate is used as a substrate 700, and the transistors 740 and 750 are formed using the single crystal silicon substrate. Single crystal silicon is used as the first semiconductor material. The transistor 740 is an n-channel transistor and the transistor 750 is a p-channel transistor. The transistor 740 and the transistor 750 which are electrically connected to each other form a complementary metal oxide semiconductor (CMOS) circuit 760.

In this embodiment, the single crystal silicon substrate imparting p-type conductivity is used as the substrate 700; thus, an n-well is formed by adding an impurity element imparting n-type conductivity to a region in which the p-channel transistor 750 is to be formed. A channel formation region 753 of the transistor 750 is formed in the n-well. As the impurity element imparting n-type conductivity, phosphorus (P), arsenic (As), or the like can be used.

Here, an impurity element imparting p-type conductivity is not added to a region in which the n-channel transistor 740 is to be formed; however, a p-well may be formed by adding an impurity element imparting p-type conductivity. As the impurity element imparting p-type conductivity, boron (B), aluminum (Al), gallium (Ga), or the like may be used.

Meanwhile, when a single-crystal silicon substrate imparting n-type conductivity is used, an impurity element imparting p-type conductivity may be added to form a p-well.

The transistor 740 includes a channel formation region 743, an n-type impurity region 744 functioning as a lightly doped drain (LDD) region or an extension region, an n-type impurity region 745 functioning as a source region or a drain region, a gate insulating film 742, and a gate electrode layer 741. The n-type impurity region 745 has a higher impurity concentration than the n-type impurity region 744. A side surface of the gate electrode layer 741 is provided with a sidewall insulating layer 746. With the use of the gate electrode layer 741 and the sidewall insulating layer 746 as masks, the n-type impurity region 744 and the n-type impurity region 745 which have different impurity concentrations can be formed in a self-aligned manner.

The transistor 750 includes the channel formation region 753, a p-type impurity region 754 functioning as a lightly doped drain (LDD) region or an extension region, a p-type impurity region 755 functioning as a source region or a drain region, a gate insulating film 752, and a gate electrode layer 751. The p-type impurity region 755 has a higher impurity concentration than the p-type impurity region 754. A side surface of the gate electrode layer 751 is provided with a sidewall insulating layer 756. With the use of the gate electrode layer 751 and the sidewall insulating layer 756 as masks, the p-type impurity region 754 and the p-type impurity region 755 which have different impurity concentrations can be formed in a self-aligned manner.

In the substrate 700, the transistor 740 and the transistor 750 are isolated from each other by an element isolation region 789. An insulating film 788 and an insulating film 687 are stacked over the transistor 740 and the transistor 750. A wiring layer 647 electrically connected to the n-type impurity region 745 through an opening in the insulating film 788 and the insulating film 687 and a wiring layer 657 electrically connected to the p-type impurity region 755 through an opening in the insulating film 788 and the insulating film 687 are provided over the insulating film 687. A wiring layer 748 is provided over the insulating film 687 so as to electrically connect the transistor 740 and the transistor 750. The wiring layer 748 is electrically connected to the n-type impurity region 745 through an opening in the insulating film 788 and the insulating film 687 and reaching the n-type impurity region 745. Further, the wiring layer 748 is electrically connected to the p-type impurity region 755 through an opening in the insulating film 788 and the insulating film 687 and reaching the p-type impurity region 755.

An insulating film 686 is provided over the insulating film 687, the wiring layer 647, the wiring layer 748, and the wiring layer 657. A wiring layer 658 is formed over the insulating film 686. The wiring layer 658 is electrically connected to a gate wiring through an opening in the insulating films 788, 687, and 686. The gate wiring is formed over the gate insulating film 742 and the channel formation region 753. The gate wiring branches into the gate electrode layer 741 and the gate electrode layer 751.

The semiconductor device of this embodiment is not limited to the structure in FIG. 7A. As the transistors 740 and 750, a transistor containing silicide or a transistor which does not include a sidewall insulating layer may be used. When a structure that contains silicide is used, resistance of the source region and the drain region can be further lowered and the speed of the semiconductor device is increased. Further, the semiconductor device can operate at low voltage; thus, power consumption of the semiconductor device can be reduced.

Next, the structures of upper elements provided over the lower transistor in the semiconductor device in FIGS. 7A and 7B are described.

An insulating film 684 is stacked over the insulating film 686 and the wiring layer 658. The conductive layer 491 and a wiring layer 692 are formed over the insulating film 684. The insulating film 434 is provided so as to cover the conductive layer 491 and the wiring layer 692. The oxide insulating film 435 is provided over the insulating film 434. Over the oxide insulating film 435, the third oxide semiconductor film 403*c*, the first oxide semiconductor film 403*a*, and the second oxide semiconductor film 403*b* are stacked in that order. Note that the compositions of the first to third oxide semiconductor films 403*a* to 403*c* are different from one another. The second oxide semiconductor film 403*b* includes a thin region. The source electrode layer 405*a* and the drain electrode layer 405*b* each including a projecting portion are provided over the second oxide semiconductor film 403*b*. The first protective layer 410*a* which overlaps with and is in contact with the source electrode layer 405*a* and the second protective layer 410*b* which overlaps with and is in contact with the drain electrode layer 405*b* are provided. The gate insulating film 402 is provided over and in contact with a thin region in the second oxide semiconductor film 403*b* which overlaps with neither the source electrode layer 405*a* nor the drain electrode layer 405*b* (a channel formation region). The gate electrode layers 401*a* and 401*b* are provided over the gate insulating film 402.

The capacitor 690 is also formed over the oxide insulating film 435 by a process similar to that of the transistor 610. The source electrode layer 405*a* serves as one electrode of the capacitor 690. Capacitor electrode layers 693*a* and 693*b* serve as the other electrode of the capacitor 690. The first protective layer 410*a* and an insulating film 682, which is formed in the same step as the gate insulating film 402, which are provided between the source electrode layer 405*a* and the capacitor electrode layer 693*a* serve as dielectrics. The capacitor electrode layers 693*a* and 693*b* are formed in the same step as the gate electrode layers 401*a* and 401*b*.

By setting the potential of the conductive layer 491 to GND (or a fixed potential), the conductive layer 491 serves as a back gate which controls the electrical characteristics of the transistor 610. The conductive layer 491 has a function of preventing static electricity. In the case where the threshold voltage of the transistor 610 is not required to be controlled by the conductive layer 491 in order to make the transistor 610 be a normally-off transistor, the conductive layer 491 is not necessarily provided. In the case where the transistor 610 is used for part of a particular circuit and a problem might be caused by providing the conductive layer 491, the conductive layer 491 is not necessarily provided in the circuit.

The wiring layer 692 is electrically connected to the wiring layer 658 through an opening in the insulating film 684. In this embodiment, planarization treatment using a CMP method is performed on the insulating film 684.

The insulating film 434 is provided between the lower portion and the upper portion in the semiconductor device. The insulating film 434 functions as a barrier film for preventing impurities such as hydrogen which cause degradation or variation in electrical characteristics of the transistor 610 from entering the upper portion from the lower portion. Thus, the insulating film 434 is preferably formed using a fine organic insulating film (e.g., an aluminum oxide film or a silicon nitride film) having a high blocking property of impurities or the like.

In the case of using the same manufacturing method as that described in Embodiment 2, the transistor 610 can be manufactured similarly to the transistor 441d. The method for manufacturing the transistor 610 is briefly described.

The conductive layer 491 and the wiring layer 692 are formed over the insulating film 684 which is provided over the transistors 740 and 750.

Next, the insulating film 434 is formed so as to cover the conductive layer 491 and the wiring layer 692.

Then, an oxide insulating film having projecting portions reflecting the shapes of the conductive layer 491 and the wiring layer 692 is formed over the insulating film 434. CMP treatment is performed on the oxide insulating film, whereby the oxide insulating film over the conductive layer 491 and the wiring layer 692 is selectively removed and the surface of the oxide insulating film is planarized. Accordingly, the planarized oxide insulating film 435 is formed.

Subsequently, part of the insulating film 434 over the top surface of the wiring layer 692 is selectively removed, so that an opening for exposing the top surface of the wiring layer 692 is formed.

Next, the third oxide semiconductor film 403c, the first oxide semiconductor film 403a, and the second oxide semiconductor film 403b are successively formed by a sputtering method without exposure to the air, and are selectively etched with one photomask.

A conductive film is formed over the second oxide semiconductor film 403b by a sputtering method or the like, and a silicon oxide film is formed over the conductive film. Next, a resist mask is formed over the silicon oxide film, and first etching is performed to remove the conductive film to approximately half the thickness so that the silicon oxide film partly has a small thickness. Ashing is performed on the resist mask for reducing the area of the resist mask. After that, second etching is performed with the resist mask, which is reduced in size, so that the source electrode layer 405a and the drain electrode layer 405b each including a projecting portion are formed. The first protective layer 410a remains over a region of the source electrode layer 405a which has a large thickness, and the second protective layer 410b remains over a region of the drain electrode layer 405b which has a large thickness. The source electrode layer 405a is electrically connected to the wiring layer 692 through the opening in the insulating film 434.

Next, the gate insulating film 402 is formed over the second oxide semiconductor film 403b, the first protective layer 410a, and the second protective layer 410b. As a material of the gate insulating film 402, a gallium oxide film is used in this embodiment.

Next, a conductive film is formed over the gate insulating film 402 by a sputtering method, an evaporation method, or the like. The conductive film is etched so that the gate electrode layers 401a and 401b and the capacitor electrode layers 693a and 693b are formed. Next, part of the gate insulating film 402 is removed with the use of the gate electrode layers 401a and 401b as masks. In the same step, part of the gate insulating film 402 is removed with the use of the capacitor electrode layers 693a and 693b as masks, so that the insulating film 682 is formed. When part of the gate insulating film 402 which is a gallium oxide film is removed, the first protective layer 410a and the second protective layer 410b which are silicon oxide films function as etching stoppers, that is, protect the source electrode layer 405a and the drain electrode layer 405b from etching treatment.

Through the above steps, the transistor 610 and the capacitor 690 are formed. Even in the case where the gate insulating film 402, which is a gallium oxide film, has a small thickness such as 20 nm or smaller, the gate insulating film 402 prevents impurities such as nitrogen from entering the second oxide semiconductor film 403b provided below the film when or after the metal oxide film containing nitrogen is formed by a sputtering method in a later step.

Next, the insulating film 407 and the interlayer insulating film 485 are formed over the transistor 610 and the capacitor 690. A cross-sectional view at this stage corresponds to FIG. 7A. Further, as described in Embodiment 1, a semiconductor device having a multilayer structure in which an embedded wiring is formed in the interlayer insulating film 485 and another semiconductor element, another wiring, or the like is formed above the embedded wiring may be manufactured.

Further, this embodiment can be freely combined with Embodiment 1 or 2.

(Embodiment 4)

Figure 8A:
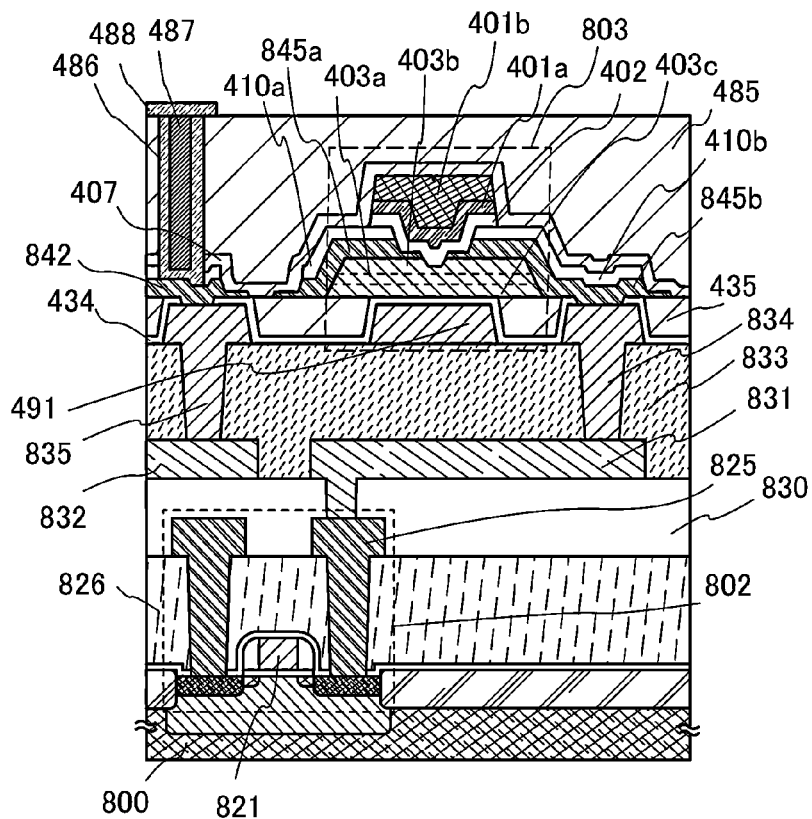
FIGS. 8A to 8C are a cross-sectional view and circuit diagrams illustrating one embodiment of a semiconductor device.
Figures 8B, 8C:
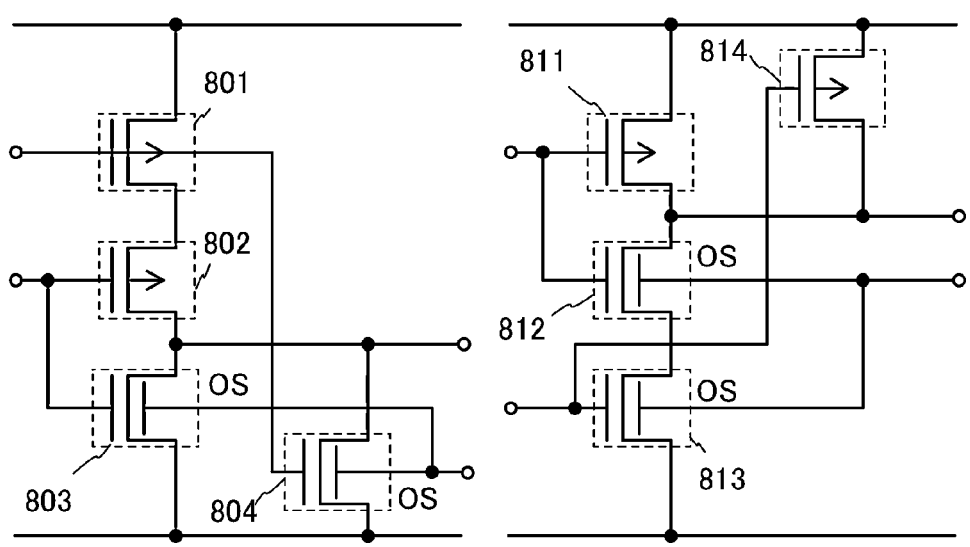

As another example of a semiconductor device including the transistors described in Embodiment 1 or 2, a cross-sectional view of a NOR circuit, which is a logic circuit, is illustrated in FIG. 8A. FIG. 8B is a circuit diagram of the NOR circuit in FIG. 8A, and FIG. 8C is a circuit diagram of a NAND circuit.

In the NOR circuit illustrated in FIGS. 8A and 8B, p-channel transistors 801 and 802 each have a structure similar to that of the transistor 750 in FIGS. 7A and 7B in that a single crystal silicon substrate is used for a channel formation region, and n-channel transistors 803 and 804 each have a structure similar to that of the transistor 610 in FIGS. 7A and 7B and that of the transistor 441d in Embodiment 2 in that the thin region in the oxide semiconductor film serves as a channel formation region.

The transistor 803 is an example in which an oxide semiconductor film has a three-layer structure: the first oxide semiconductor film 403a is stacked over the third oxide semiconductor film 403c and the second oxide semiconductor film 403b is stacked over the first oxide semiconductor film 403a. The compositions of the first to third oxide semiconductor films 403a to 403c are different from one another. The thin region included in the second oxide semiconductor film 403b can be the channel formation region.

Note that the following structure may be employed: an insulating film containing gallium oxide is provided between the oxide insulating film 435 and the first oxide semiconductor film 403a, the second oxide semiconductor film 403b is stacked over the first oxide semiconductor film 403a having a composition different from that of the second oxide semiconductor film 403b, and the second oxide semiconductor film 403b includes the thin region. In such a structure, oxygen is supplied to the stack of oxide semiconductor films from the insulating film containing gallium oxide, which includes an oxygen-excess region where the proportion of oxygen in the oxide semiconductor film is higher than that in the stoichiometric composition exists. Thus, oxygen doping treatment does not need to be performed on the oxide insulating film 435. In addition, the insulating film 434 covering the conductive layer 491 is formed, an oxide insulating film 435 is polished, part of the insulating film 434 is exposed, and the insulating film containing gallium oxide is provided so as to overlap with the exposed portion.

In the transistor 803 in the NOR circuit illustrated in FIGS. 8A and 8B, the conductive layer 491 is provided so as to overlap with a gate electrode layer with an oxide semiconductor film provided therebetween in order to control the electrical characteristics of the transistor. By controlling the potential of the conductive layer to GND, for example, the threshold voltage of the transistor 803 is increased, so that the transistors can be normally off. In the NOR circuit in this embodiment, conductive layers which are provided in the transistors 803 and 804 and can function as back gates are electrically connected to each other. However, the present invention is not limited to the structure, and the conductive layers functioning as back gates may be electrically controlled independently.

In the semiconductor device illustrated in FIG. 8A, a single crystal silicon substrate is used as a substrate 800, the transistor 802 is formed using the single crystal silicon substrate, and the transistor 803 in which a stack of oxide semiconductor films is used for a channel formation region is formed over the transistor 802.

The gate electrode layers 401a and 401b of the transistor 803 are electrically connected to a wiring layer 832. The wiring layer 832 is electrically connected to a wiring layer 835. The gate electrode layers 401a and 401b of the transistor 803 are electrically connected to an embedded wiring, and the embedded wiring is electrically connected to a conductive layer 842. Note that the embedded wiring includes the first barrier metal film 486, the second barrier metal film 488, and the low-resistance conductive layer 487 covered by the first barrier metal film 486 and the second barrier metal film 488. The method for forming the embedded wiring is described in Embodiment 1. Thus, detailed description thereof is omitted here.

The wiring layer 832 is formed over the insulating film 830, the wiring layer 835 is formed in an opening in an insulating film 833, and the conductive layer 842 is formed in an opening in the insulating film 434.

An electrode layer 825 of the transistor 802 is electrically connected to an electrode layer 845b of the transistor 803 through wiring layers 831 and 834. The wiring layer 831 is formed in an opening in the insulating film 830, the wiring layer 834 is formed in an opening in the insulating film 833, and the electrode layer 845b is formed in an opening in the insulating film 434. An electrode layer 845a and the electrode layer 845b function as source and drain electrode layers of the transistor 803.

In the case where the insulating film contains gallium oxide, a gallium oxide film having an amorphous structure is used as the insulating film containing gallium oxide. The first oxide semiconductor film 403a is formed to be what we call a CAAC-OS film using an oxide target containing In, Ga, and Zn at an atomic ratio of 3:1:2 in an oxygen atmosphere (oxygen: 100%). The film includes a crystal part in which c-axes are aligned in the direction parallel to a normal vector of a surface where the film is formed or a normal vector of a surface of the film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. The second oxide semiconductor film 403b is formed to be a CAAC-OS film using an oxide target containing In, Ga, and Zn at an atomic ratio of 1:1:1 in an oxygen atmosphere (oxygen: 100%). The sum of the thicknesses of the first oxide semiconductor film 403a and the second oxide semiconductor film 403b of the completed transistor is greater than or equal to 5 nm and less than or equal to 10 nm. An example in which the oxide semiconductor film includes crystal parts shortly after the oxide semiconductor film is formed is described in this embodiment; however, crystal parts may be formed by performing heat treatment after the film formation.

In the case where the first oxide semiconductor film 403a is formed over and in contact with the insulating film which is a gallium oxide film, and the gate insulating film 402, which is a gallium oxide film, is formed over and in contact with the second oxide semiconductor film 403b, oxygen can be efficiently supplied to the first oxide semiconductor film 403a and the second oxide semiconductor film 403b. By providing the insulating film and the gate insulating film 402, which are gallium oxide films, unnecessary release of oxygen can be suppressed, and the first oxide semiconductor film 403a can be kept in an oxygen excess state. Thus, in the transistor 803, oxygen vacancies in the first oxide semiconductor film 403a and at the interface between the insulating film and the first oxide semiconductor film 403a can be compensated efficiently.

In the NAND circuit in FIG. 8C, p-channel transistors 811 and 814 each have a structure similar to that of the transistor 750 in FIGS. 7A and 7B, and n-channel transistors 812 and 813 each have a structure similar to that of the transistor 610 in FIGS. 7A and 7B in that the thin region in the oxide semiconductor film serves as a channel formation region.

In the transistors 812 and 813 in the NAND circuit illustrated in FIG. 8C, a conductive layer is provided so as to overlap with a gate electrode layer with an oxide semiconductor film provided therebetween in order to control the electrical characteristics of the transistors. By controlling the potential of the conductive layer to GND, for example, the threshold voltages of the transistors 812 and 813 are increased, so that the transistors can be normally off. In the NAND circuit in this embodiment, conductive layers which are provided in the transistors 812 and 813 and function as back gates are electrically connected to each other. However, the present invention is not limited to the structure, and the conductive layers functioning as back gates may be electrically controlled independently.

By applying a transistor including an oxide semiconductor for a channel formation region and having extremely small off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

The NOR circuit and the NAND circuit including the transistors described in Embodiment 1 or 2 are described as examples in this embodiment; however, the present invention is not limited to the circuits, and an AND circuit, an OR circuit, or the like can be formed using the transistors described in Embodiment 1 or 2. For example, a semiconductor device (storage device) in which stored data can be held even when power is not supplied and which has an unlimited number of times of writing with the transistors described in Embodiment 1 or 2 can be manufactured.

Figure 9:
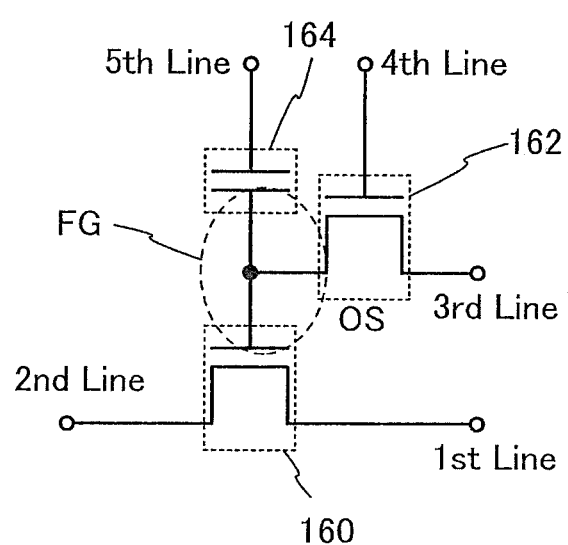
FIG. 9 is a circuit diagram illustrating one embodiment of a semiconductor device.

FIG. 9 is an example of a circuit diagram of a semiconductor device.

In FIG. 9, a first wiring (1st Line) is electrically connected to a source electrode layer of a transistor 160. A second wiring (2nd Line) is electrically connected to a drain electrode layer of the transistor 160. Any of the transistors 740 and 750 described in Embodiment 3, the transistor 802 described in this embodiment, and the like can be used as the transistor 160.

A third wiring (3rd Line) is electrically connected to one of a source and a drain electrode layers of a transistor 162, and a fourth wiring (4th Line) is electrically connected to a gate electrode layer of the transistor 162. A gate electrode layer of the transistor 160 and the other of the source and drain electrode layers of the transistor 162 are electrically connected to one electrode of a capacitor 164. A fifth wiring (5th Line) is electrically connected to the other electrode of the capacitor 164.

For the transistor 162, any of the structures of the transistors 440a, 440b, 440c, 440d, 441a, 441b, 441c, 441d, and 441e described in Embodiment 1 or 2, the structure of the transistor 610 described in Embodiment 3, and the structure of the transistor 803 described in this embodiment can be used.

The semiconductor device having the circuit configuration in FIG. 9 utilizes a characteristic in which the potential of the gate electrode layer of the transistor 160 can be held, and thus enables data writing, holding, and reading as follows.

Writing and holding of data are described. First, the potential of the fourth wiring is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, one of two kinds of charges providing different potentials (hereinafter referred to as a low-level charge and a high-level charge) is applied. After that, the potential of the fourth wiring is set to a potential at which the transistor 162 is turned off, so that the transistor 162 is turned off. Thus, the charge supplied to the gate electrode layer of the transistor 160 is held (holding).

Since the off-state current of the transistor 162 is extremely small, the charge of the gate electrode layer of the transistor 160 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held at the gate electrode layer of the transistor 160. This is because in general, when the transistor 160 is an n-channel transistor, an apparent threshold voltage $V_{th\_H}$ in the case where the high-level potential is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth wiring which is needed to turn on the transistor 160. Thus, the potential of the fifth wiring is set to a potential $V_0$ between $V_{th\_H}$ and $V_{th\_L}$, whereby charge supplied to the gate electrode layer of the transistor 160 can be determined. For example, in the case where the high-level charge is supplied in writing, when the potential of the fifth wiring is $V_0$ ($>V_{th\_H}$), the transistor 160 is turned on. In the case where the low-level charge is supplied in writing, even when the potential of the fifth wiring is $V_0$ ($<V_{th\_L}$), the transistor 160 remains off. Therefore, the held data can be read by measuring the potential of the second wiring.

Note that in the case where memory cells are arrayed to be used, only data of desired memory cells needs to be read. In the case where such reading is not performed, a potential at which the transistor 160 is turned off regardless of the state of the gate electrode layer of the transistor 160, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth line.

Figure 10:
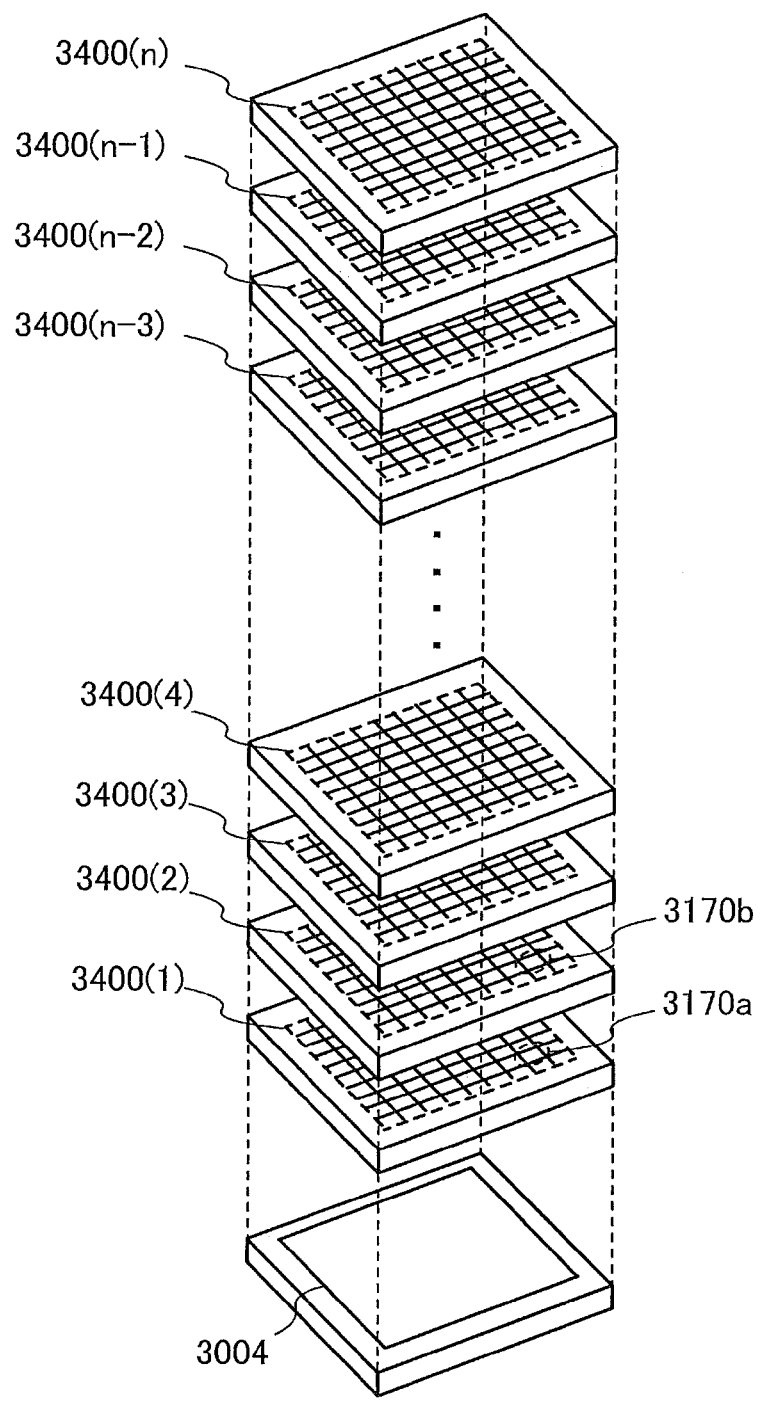
FIG. 10 is a perspective view illustrating one embodiment of a semiconductor device.

FIG. 10 illustrates another example of one embodiment of the structure of the storage device.

FIG. 10 is a perspective view of a memory device. The memory device illustrated in FIG. 10 includes a plurality of layers of memory cell arrays (memory cell arrays 3400(1) to 3400(n) (n is an integer greater than or equal to 2)) each including a plurality of memory cells as memory circuits in the upper portion, and a logic circuit 3004 in the lower portion which is necessary for operating the memory cell arrays 3400 (1) to 3400(n).

FIG. 10 illustrates the logic circuit 3004, the memory cell array 3400(1), and the memory cell array 3400(2), and illustrates a memory cell 3170a and a memory cell 3170b as typical examples among the plurality of memory cells included in the memory cell array 3400(1) and the memory cell array 3400(2). The memory cell 3170a and the memory cell 3170b can have a configuration similar to the circuit configuration described in this embodiment with reference to FIG. 9, for example.

A transistor in which a thin region in an oxide semiconductor film serves as a channel formation region is used as each transistor included in the memory cells 3170a and 3170b. The structure of the transistor in which the thin region in the oxide semiconductor film serves as a channel formation region is the same as the structure described in Embodiment 1 or 2; thus, the description of the structure is omitted.

The logic circuit 3004 includes a transistor in which a semiconductor material other than an oxide semiconductor is used as a channel formation region. For example, the transistor can be a transistor obtained in such a manner that an element isolation insulating layer is provided on a substrate including a semiconductor material (e.g., silicon) and a region serving as the channel formation region is formed in a region surrounded by the element isolation insulating layer. Note that the transistor may be a transistor obtained in such a manner that the channel formation region is formed in a semiconductor film such as a polycrystalline silicon film formed on an insulating surface or in a silicon film of an SOI substrate.

The memory cell arrays 3400(1) to 3400(n) and the logic circuit 3004 are stacked with interlayer insulating layers provided therebetween, and electrical connection or the like may be established as appropriate by an electrode or a wiring penetrating the interlayer insulating layers.

When a transistor in which a thin region in an oxide semiconductor film serves as a channel formation region and off-state current is extremely small is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electrical characteristics and a method for manufacturing the semiconductor device can be provided.

This embodiment can be freely combined with any of Embodiment 1, Embodiment 2, and Embodiment 3.

(Embodiment 5)

In this embodiment, a central processing unit (CPU) at least part of which includes any of the transistors 440a, 440b, 440c, 440d, 441a, 441b, 441c, 441d, and 441e described in Embodiment 1 or 2 is described as an example of a semiconductor device in this embodiment.

Figure 11A:
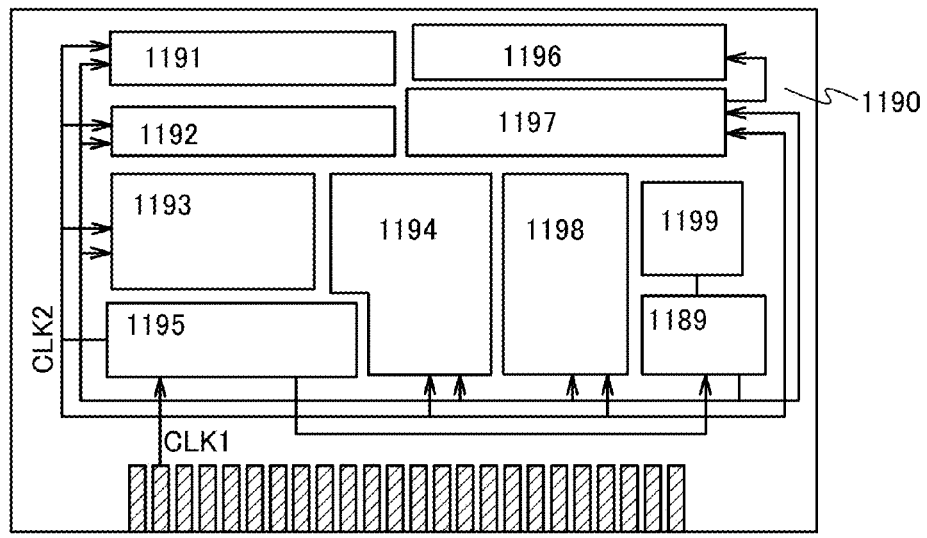
FIGS. 11A to 11C are block diagrams each illustrating one embodiment of a semiconductor device.

FIG. 11A is a block diagram illustrating a specific structure of the CPU. The CPU illustrated in FIG. 11A includes an arithmetic logic unit (ALU, an arithmetic logic circuit) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU shown in FIG. 11A is just an example in which the configuration has been simplified, and an actual CPU may have a variety of configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct a variety of controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 11A, a memory cell is provided in the register 1196. As the memory cell of the register 1196, the memory cell described in Embodiment 4 can be used.

In the CPU illustrated in FIG. 11A, the register controller 1197 selects an operation of holding data in the register 1196 in accordance with an instruction from the ALU 1191. That is, the register controller 1197 selects whether data is held by a flip-flop or a capacitor in the memory cell included in the register 1196. When data holding by the flip-flop is selected, power supply voltage is supplied to the memory cell in the register 1196. When data holding by the capacitor is selected, the data is rewritten in the capacitor, and supply of power supply voltage to the memory cell in the register 1196 can be stopped.

Figure 11B:
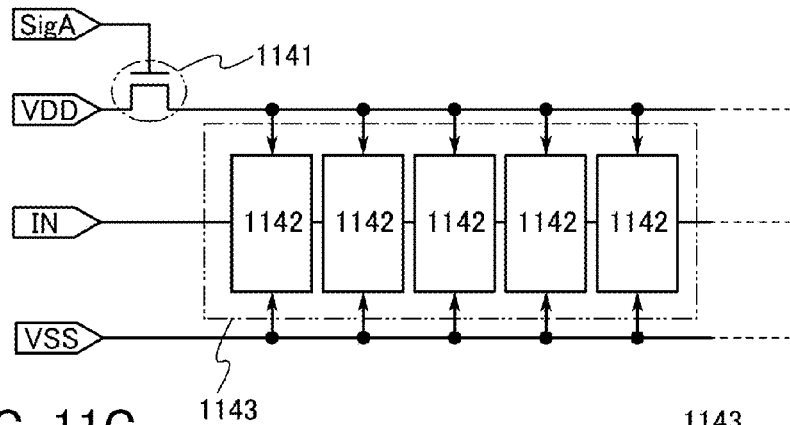
Figure 11C:
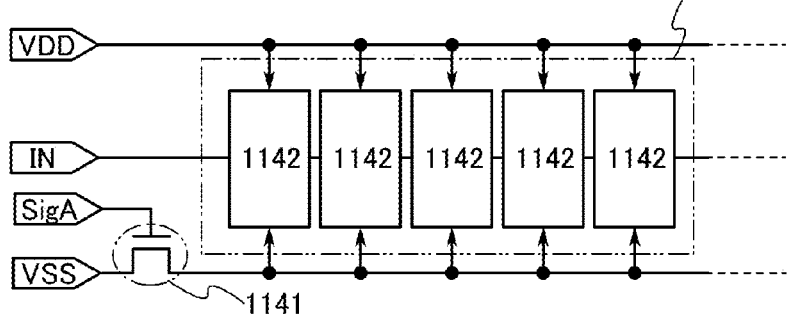

The power supply can be stopped by providing a switching element between a memory cell group and a node to which a power supply potential VDD or a power supply potential VSS is supplied, as illustrated in FIG. 11B or FIG. 11C. Circuits illustrated in FIGS. 11B and 11C are described below.

FIGS. 11B and 11C each illustrate an example of a structure of a memory circuit in which any of the transistors 440a, 440b, 440c, 440d, 441a, 441b, 441c, 441d, and 441e described in Embodiment 1 or 2 is used as a switching element for controlling supply of a power supply potential to a memory cell.

The memory device illustrated in FIG. 11B includes a switching element 1141 and a memory cell group 1143 including a plurality of memory cells 1142. Specifically, as each of the memory cells 1142, the memory cell described in Embodiment 3 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 11B, any of the transistors 440a, 440b, 440c, 440d, 441a, 441b, 441c, 441d, and 441e described in Embodiment 1 or 2 is used as the switching element 1141, and the switching of the transistor is controlled by a signal Sig A supplied to a gate electrode layer thereof.

Note that FIG. 11B illustrates the structure in which the switching element 1141 includes only one transistor; however, without particular limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 11B, the switching element 1141 may control the supply of the low-level power supply potential VSS.

In FIG. 11C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The structures, methods, and the like which are described in this embodiment can be combined as appropriate with any of the structures, methods, and the like which are described in the other embodiments.

(Embodiment 6)

In this embodiment, a display device including a bottom-gate transistor is described as an example. The bottom-gate transistor can be formed by a method partly different from the method for manufacturing the transistor described in Embodiment 1 or Embodiment 2; for example, an oxide insulating film is formed after a gate electrode layer is formed, a stack of oxide semiconductor films is formed without CMP treatment, and a source electrode layer and a drain electrode layer are formed thereover. After the source electrode layer and the drain electrode layer are formed, wet etching using dilute hydrofluoric acid is performed so that part of the oxide semiconductor film is thinned; thus, a channel-etched transistor can be formed.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as an electronic ink display device (electronic paper), can be used.

Embodiments of the display device are described with reference to FIGS. 12A and 12B. Examples of a liquid crystal display device using a liquid crystal element as a display element are illustrated in FIGS. 12A and 12B.

A liquid crystal display device can employ a vertical electric field mode or a horizontal electric field mode. FIG. 12A illustrates an example in which a vertical electric field mode is employed, and FIG. 12B illustrates and example in which a fringe field switching (FFS) mode, which is one of horizontal electric field modes, is employed.

Note that a transistor 4010 provided in the pixel portion 4002 is electrically connected to a display element to form a display panel. A variety of display elements can be used as the display element as long as display can be performed.

As illustrated in FIGS. 12A and 12B, the display device includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed from the same conductive layer as a first electrode layer 4034. The terminal electrode 4016 is formed from the same conductive layer as source drain electrode layers of the transistor 4010 and a transistor 4011.

The pixel portion 4002 and the scan line driver circuit 4004 provided over the substrate 4001 include a plurality of transistors. FIGS. 12A and 12B illustrate the transistor 4010 included in the pixel portion 4002 and the transistor 4011 included in the scan line driver circuit 4004. In FIGS. 12A and 12B, an insulating layer 4032 is provided over the transistors 4010 and 4011.

In FIG. 12B, a planarization insulating layer 4040 is provided over the insulating layer 4032, and an insulating layer 4042 is provided between the first electrode layer 4034 and the second electrode layer 4031.

Any of the transistors described in Embodiments 1 or 2 can be applied to the transistor 4010 and the transistor 4011. The transistors 4010 and 4011 are bottom-gate transistors.

In each of the transistors 4010 and 4011, a second oxide semiconductor film which functions as a current path (channel) is sandwiched between first and third oxide semiconductor films which have lower carrier densities than the second oxide semiconductor film. Accordingly, each of the transistors 4010 and 4011 is a buried-channel transistor in which a current path is separated from the interface with the insulating layer, and therefore has high field-effect mobility. In addition, each of the transistors 4010 and 4011 is a highly reliable transistor in which influence of an interface state which might be formed on the back channel side is reduced and photodegradation (e.g., negative-bias temperature stress photodegradation) is reduced.

Moreover, a conductive layer may be provided so as to overlap with a channel formation region in the oxide semiconductor film of the transistor 4011 for the driver circuit. When the conductive layer is provided so as to overlap with the channel formation region in the oxide semiconductor film, the amount of change in the threshold voltage of the transistor 4011 can be further reduced. The conductive layer may have the same potential as or a potential different from that of a gate electrode layer of the transistor 4011, and can function as a second gate electrode layer. The potential of the conductive layer may be GND, 0 V, or in a floating state.

In addition, the conductive layer has a function of blocking an external electric field, that is, a function of preventing an external electric field (particularly, a function of preventing static electricity) from affecting the inside (a circuit portion including a transistor). A blocking function of the conductive layer can prevent variation in the electrical characteristics of the transistor due to an influence of an external electric field such as static electricity.

In FIGS. 12A and 12B, a liquid crystal element 4013 includes a first electrode layer 4034, a second electrode layer 4031, and a liquid crystal layer 4008. Note that insulating layers 4033 and 4038 functioning as alignment films are provided so that the liquid crystal layer 4008 is positioned therebetween.

In FIG. 12A, the second electrode layer 4031 is provided on the substrate 4006 side, and the first electrode layer 4034 and the second electrode layer 4031 are stacked with the liquid crystal layer 4008 provided therebetween. In FIG. 12B, the second electrode layer 4031 having an opening pattern is provided below the liquid crystal layer 4008, and the first electrode layer 4034 having a flat plate shape is provided below the second electrode layer 4031 with the insulating layer 4042 provided therebetween. In FIG. 12B, the second electrode layer 4031 having an opening pattern includes a bent portion or a comb-shaped portion. An arrangement of the first electrode layer 4034 and the second electrode layer 4031, which complies with both conditions that they have the same shape and they completely overlap with each other, is avoided in order to generate an electric field between the electrodes. Note that a structure may be employed in which the second electrode layer 4031 having a flat plate shape is formed over and in contact with the planarization insulating layer 4040, and the first electrode layer 4034 having an opening pattern and serving as a pixel electrode is formed over the second electrode layer 4031 with the insulating layer 4042 provided therebetween.

The first electrode layer 4034 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layer 4034 and the second electrode layer 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A conductive composition containing a conductive high molecule (also referred to as a conductive polymer) can be used for the first electrode layer 4034 and the second electrode layer 4031. As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

A spacer 4035 is a columnar spacer obtained by selective etching of an insulating layer and is provided in order to control the thickness of the liquid crystal layer 4008 (a cell gap). Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystal materials may be a low molecular compound or a high molecular compound. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor film, which is disclosed in this specification, it is enough to provide a storage capacitor having a capacitance that is ⅓ or less, preferably ⅕ or less of liquid crystal capacitance of each pixel.

In the transistor including an oxide semiconductor film, which is disclosed in this specification, the current in an off state (off-state current) can be made small. Accordingly, an electric signal such as an image signal can be held for a longer period and a writing interval can be set longer. Accordingly, the frequency of refresh operation can be reduced, which leads to an effect of suppressing power consumption.

The transistor including an oxide semiconductor film, which is disclosed in this specification, can have high field-effect mobility; thus, the transistor can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

For the liquid crystal display device, a twisted nematic (TN) mode, an in-plane-switching (IPS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an organic EL element is used as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figure 13A:
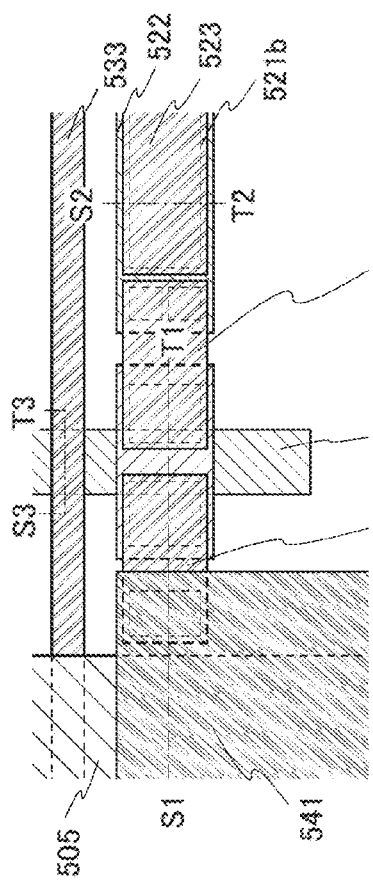
FIGS. 13A and 13B are a top view and a cross-sectional view illustrating one embodiment of the present invention.
Figure 13B:
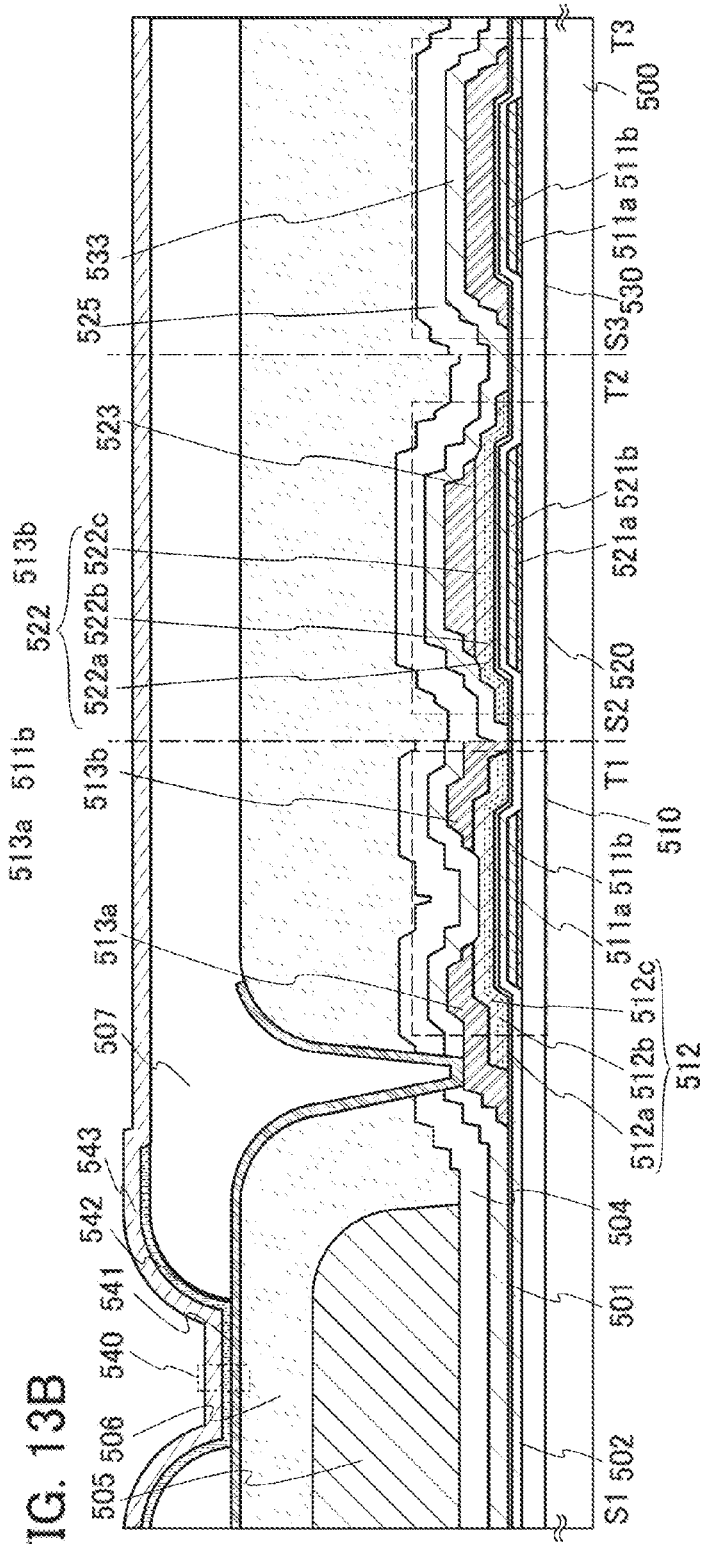

FIGS. 13A and 13B illustrate an example of a light-emitting device using a light-emitting element as a display element.

FIG. 13A is a plan view of the light-emitting device, and FIG. 13B is a cross-sectional view taken along dashed-dotted lines S1-T1, S2-T2, and S3-T3 in FIG. 13A. Note that an electroluminescent layer 542 and a second electrode layer 543 are not illustrated in the plan view in FIG. 13A.

The light-emitting device illustrated in FIGS. 13A and 13B includes, over a substrate 500, a transistor 510, a capacitor 520, and a wiring layer intersection 530. The transistor 510 is electrically connected to a light-emitting element 540. Note that FIGS. 13A and 13B illustrate a bottom-emission light-emitting device in which light from the light-emitting element 540 is extracted through the substrate 500.

The transistor 510 is a bottom-gate transistor.

The transistor 510 includes gate electrode layers 511a and 511b; gate insulating films 501 and 502; an oxide semiconductor stack 512 including a first oxide semiconductor film 512a, an n-type second oxide semiconductor film 512b, and a third oxide semiconductor film 512c; and conductive layers 513a and 513b serving as a source electrode layer and a drain electrode layer. In addition, an insulating layer 525 is formed over the transistor 510.

The capacitor 520 includes conductive layers 521a and 521b; the gate insulating films 501 and 502; an oxide semiconductor stack 522 including a first oxide semiconductor film 522a, a second oxide semiconductor film 522b containing an impurity imparting n-type conductivity, and a third oxide semiconductor film 522c; and a conductive layer 523. The gate insulating films 501 and 502 and the oxide semiconductor stack 522 are sandwiched between the conductive layer 523 and the conductive layers 521a and 521b, whereby the capacitor is formed.

The wiring layer intersection 530 is an intersection of a conductive layer 533 and the gate electrode layers 511a and 511b. The conductive layer 533 and the gate electrode layers 511a and 511b intersect with each other with the gate insulating films 501 and 502 provided therebetween.

In this embodiment, a 30-nm-thick titanium film is used as each of the gate electrode layer 511a and the conductive layer 521a, and a 200-nm-thick copper film is used as each of the gate electrode layer 511b and the conductive layer 521b. Thus, the gate electrode layer has a stacked-layer structure of the titanium film and the copper film.

In the transistor 510, the second oxide semiconductor film which functions as a current path (channel) is sandwiched between the first oxide semiconductor film and the third oxide semiconductor film which have lower carrier densities than the second oxide semiconductor layer. Accordingly, the transistor 510 is a buried-channel transistor in which a current path is separated from the interface with the insulating layer, and therefore has high field-effect mobility. In addition, the transistor 510 is a highly reliable transistor in which influence of an interface state which might be formed on the back channel side is reduced and photodegradation (e.g., negative-bias temperature stress photodegradation) is reduced.

Further, the transistor 510 includes a stack of a first nitrogen-containing silicon film which functions as a barrier film against copper and whose ammonia content is reduced, a second nitrogen-containing silicon film having a large thickness (e.g., 300 nm) in which the number of defects is reduced, and a third nitrogen-containing silicon film in which the hydrogen concentration is reduced as the gate insulating film 502, and includes an oxide insulating layer as the gate insulating film 501. With such a structure, the transistor 510 can have favorable electrical characteristics and electrostatic breakdown of the transistor 510 can be prevented. Accordingly, a highly reliable semiconductor device can be provided with high yield.

An interlayer insulating layer 504 is formed over the transistor 510, the capacitor 520, and the wiring layer intersection 530. Over the interlayer insulating layer 504, a color filter layer 505 is provided in a region overlapping with the light-emitting element 540. An insulating layer 506 functioning as a planarization insulating layer is provided over the interlayer insulating layer 504 and the color filter layer 505.

The light-emitting element 540 having a stacked-layer structure in which a first electrode layer 541, the electroluminescent layer 542, and the second electrode layer 543 are stacked in this order is provided over the insulating layer 506. The first electrode layer 541 and the conductive layer 513a are in contact with each other in an opening formed in the insulating layer 506 and the interlayer insulating layer 504, which reaches the conductive layer 513a; thus the light-emitting element 540 and the transistor 510 are electrically connected to each other. Note that a partition 507 is provided so as to cover part of the first electrode layer 541 and the opening.

Further, a 1500-nm-thick photosensitive acrylic film and a 1500-nm-thick photosensitive polyimide film can be used as the insulating layer 506 and the partition 507, respectively.

As the color filter layer 505, for example, a chromatic color light-transmitting resin can be used. As the chromatic color light-transmitting resin, a photosensitive organic resin or a non-photosensitive organic resin can be used. The photosensitive organic resin is preferably used, in which case the number of resist masks can be reduced, which results in the simplification of the process.

Chromatic colors are all colors except achromatic colors such as black, gray, and white. The color filter layer is formed using a material which transmits only light of the chromatic colors. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

The partition 507 can be formed using an organic insulating material or an inorganic insulating material. It is particularly preferable that the partition 507 be formed using a photosensitive resin material to have an opening over the first electrode layer 541. A sidewall of the opening is preferably formed as a tilted surface with continuous curvature.

The electroluminescent layer 542 may be formed using either a single layer or a stack of a plurality of layers.

A protective film may be formed over the second electrode layer 543 and the partition 507 in order to prevent entry of oxygen, hydrogen, moisture, carbon dioxide, or the like into the light-emitting element 540. As the protective film, a silicon nitride film, a silicon nitride oxide film, a DLC film, or the like can be formed.

Further, the light-emitting element 540 may be covered with a layer containing an organic compound deposited by an evaporation method so that oxygen, hydrogen, moisture, carbon dioxide, or the like do not enter the light-emitting element 540.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The insulating layer 506 functioning as a planarization insulating layer can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material) such as a siloxane-based resin, phosphosilicate glass (PSG), or borophosphosilicate glass (BPSG). Note that the insulating layer 506 may be formed by stacking a plurality of insulating layers formed using any of these materials.

There is no particular limitation on the method of forming the insulating layer 506; the following method can be used depending on the material: a sputtering method, spin coating, dipping, spray coating, a droplet discharge method (such as an inkjet method), screen printing, offset printing, or the like.

Materials similar to those of the first electrode layer 4034 and the second electrode layer 4031 illustrated in FIG. 12A or FIG. 12B can be used for the first electrode layer 541 and the second electrode layer 543.

In this embodiment, since the light-emitting device illustrated in FIGS. 13A and 13B has a bottom-emission structure, the first electrode layer 541 has a light-transmitting property and the second electrode layer 543 has a light-reflecting property. Accordingly, in the case of using a metal film as the first electrode layer 541, the film is preferably made thin enough to secure a light-transmitting property; and in the case of using a light-transmitting conductive layer as the second electrode layer 543, a light-reflecting conductive layer is preferably stacked therewith.

A protection circuit for protecting the driver circuit may be provided. The protection circuit is preferably formed using a nonlinear element.

The structures, methods, and the like described in this embodiment can be combined as appropriate with any of the structures, methods, and the like described in the other embodiments.

(Embodiment 7)

A semiconductor device disclosed in this specification can be applied to a variety of electronic devices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, spacecrafts, and the like. Specific examples of these electronic devices are illustrated in FIGS. 22A to 22C and FIGS. 23A to 23C.

Figure 22A:
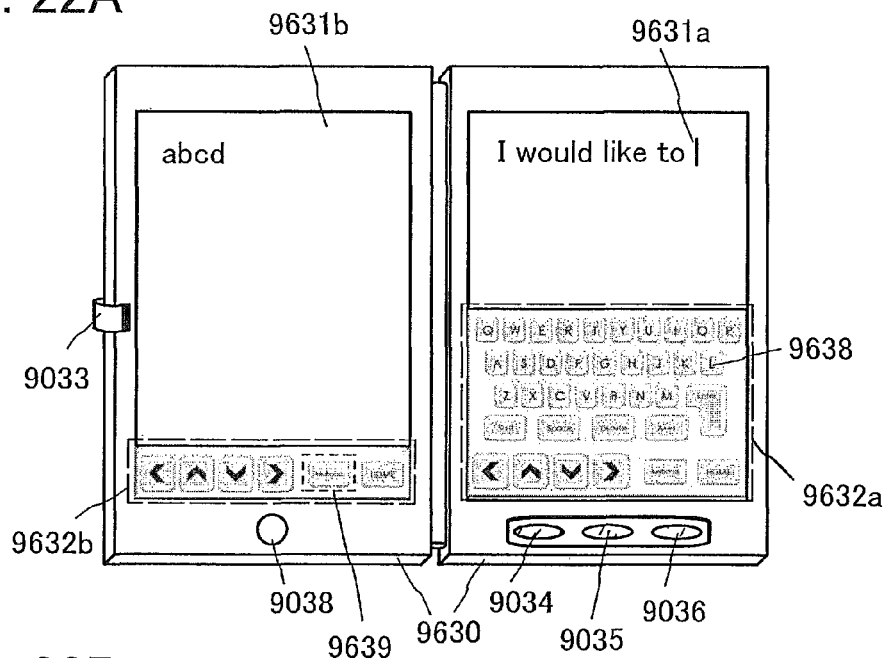
FIGS. 22A to 22C illustrate an electronic device.
Figure 22B:
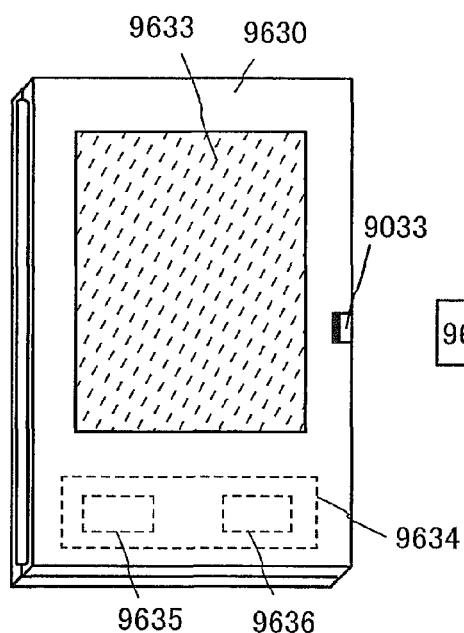

FIGS. 22A and 22B illustrate a tablet terminal that can be folded in two. FIG. 22A illustrates the tablet terminal which is open. The tablet terminal includes a housing 9630, a display portion 9631*a*, a display portion 9631*b*, a switch 9034 for switching display modes, a power switch 9035, a switch 9036 for switching to power-saving mode, a fastener 9033, and an operation switch 9038.

In such a portable device illustrated in FIGS. 22A and 22B, an SRAM or a DRAM is used as a memory element for temporarily storing image data. For example, the semiconductor device described in Embodiment 4 can be used as a memory. The semiconductor device described in the above embodiment employed for the memory element enables writing and reading of data to be performed at high speed, enables data to be retained for a long time, and enables power consumption to be sufficiently reduced. A CPU for performing image processing or arithmetic processing is used in the portable device illustrated in FIGS. 22A and 22B. As the CPU, the CPU described in Embodiment 5 can be used, in which case the CPU described in Embodiment 5 is used, power consumption of the portable device can be reduced.

Part of the display portion 9631a can be a touch panel region 9632a, and data can be input by touching operation keys 9638 that are displayed. The display device described in Embodiment 6 can be applied to the display portion 9631a. Note that FIG. 22A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although FIG. 22A shows the example where the display area of the display portion 9631a is the same as that of the display portion 9631b, there is no particular limitation on the display portions 9631a and 9631b. They may differ in size and/or image quality. For example, one of them may be a display panel that can display higher-definition images than the other.

FIG. 22B illustrates the tablet terminal which is closed. The tablet terminal includes the housing 9630, a solar battery 9633, a charge/discharge control circuit 9634, a battery 9635, and a DC-DC converter 9636. As an example, FIG. 22B illustrates the charge/discharge control circuit 9634 including the battery 9635 and the DC-DC converter 9636.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

The tablet terminal illustrated in FIGS. 22A and 22B can also have a function of displaying a variety of kinds of data (e.g., a still image, a moving image, and a text image), a function of displaying a calendar, a date, the time, or the like on the display portion, a touch-input function of operating or editing data displayed on the display portion by touch input, a function of controlling processing by a variety of kinds of software (programs), and the like.

Power can be supplied to a touch panel, a display portion, an image signal processor, or the like by the solar battery 9633 attached on a surface of the tablet terminal. Note that the solar battery 9633 can be provided on one or both surfaces of the housing 9630, so that the battery 9635 can be charged efficiently. The use of a lithium ion battery as the battery 9635 brings an advantage such as reduction in size.

Figure 22C:
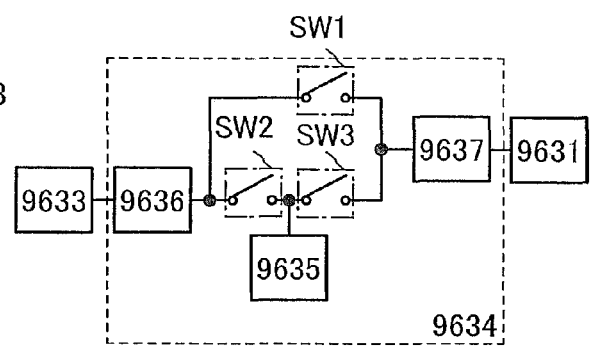

The structure and operation of the charge/discharge control circuit 9634 illustrated in FIG. 22B are described with reference to a block diagram in FIG. 22C. FIG. 22C illustrates the solar battery 9633, the battery 9635, the DC-DC converter 9636, a converter 9637, switches SW1 to SW3, and the display portion 9631. The battery 9635, the DC-DC converter 9636, the converter 9637, and the switches SW1 to SW3 correspond to the charge/discharge control circuit 9634 illustrated in FIG. 22B.

An example of the operation performed when power is generated by the solar battery 9633 using external light is described. The voltage of power generated by the solar battery is raised or lowered by the DC-DC converter 9636 so as to be a voltage for charging the battery 9635. Then, when power from the solar battery 9633 is used for the operation of the display portion 9631, the switch SW1 is turned on and the voltage of the power is raised or lowered by the converter 9637 so as to be a voltage needed for the display portion 9631. When images are not displayed on the display portion 9631, the switch SW1 is turned off and the switch SW2 is turned on so that the battery 9635 is charged.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 23A:
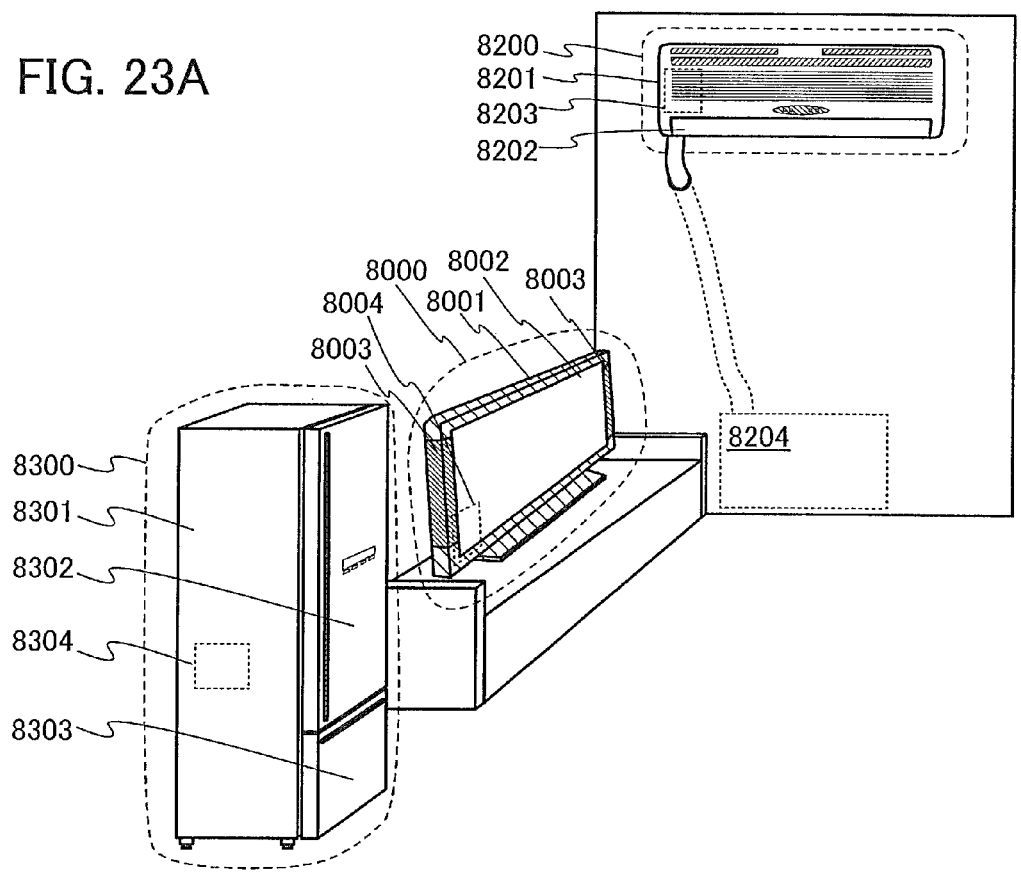
FIGS. 23A to 23C illustrate electronic devices.

In a television set 8000 in FIG. 23A, a display portion 8002 is incorporated in a housing 8001. The display portion 8002 displays an image and a speaker portion 8003 can output sound.

A semiconductor display device such as a liquid crystal display device described in Embodiment 6, a light-emitting device described in Embodiment 6 in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. A general television broadcast can be received with the receiver in television set 8000. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The memory described in Embodiment 4 or the CPU described in Embodiment 5 can be used in the television set 8000.

In FIG. 23A, an air conditioner which includes an indoor unit 8200 and an outdoor unit 8204 is an example of an electric device in which the CPU of Embodiment 5 is used. Specifically, the indoor unit 8200 includes a housing 8201, an air outlet 8202, a CPU 8203, and the like. Although the CPU 8203 is provided in the indoor unit 8200 in FIG. 23A, the CPU 8203 may be provided in the outdoor unit 8204. Alternatively, the CPU 8203 may be provided in both the indoor unit 8200 and the outdoor unit 8204. By using the CPU described in Embodiment 5 as the CPU in the air conditioner, power consumption can be reduced.

In FIG. 23A, an electric refrigerator-freezer 8300 is an example of an electric device which is provided with the CPU formed using an oxide semiconductor. Specifically, the electric refrigerator-freezer 8300 includes a housing 8301, a door for a refrigerator 8302, a door for a freezer 8303, a CPU 8304, and the like. The CPU 8304 is provided in the housing 8301 in FIG. 23A. When the CPU described in Embodiment 5 is used as the CPU 8304 of the electric refrigerator-freezer 8300, power consumption of the electric refrigerator-freezer 8300 can be reduced.

Figure 23B:
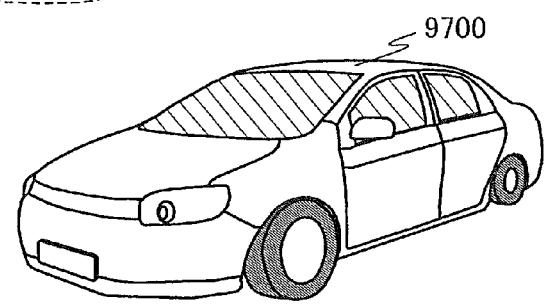
Figure 23C:
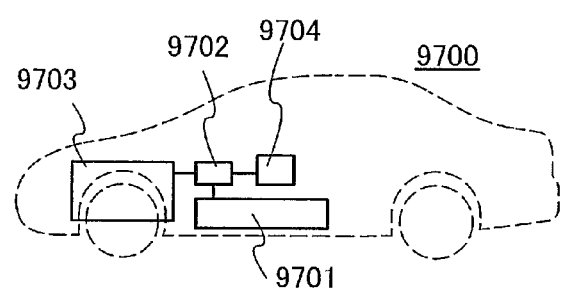

FIG. 23B illustrates an example of an electric vehicle. An electric vehicle 9700 is equipped with a secondary battery 9701. The output of the electric power of the secondary battery 9701 is adjusted by a control circuit 9702 so that the electric power is supplied to a driving device 9703. The control circuit 9702 is controlled by a processing unit 9704 including a ROM, a RAM, a CPU, or the like which is not illustrated. By using the CPU described in Embodiment 5 as the CPU in the electric vehicle 9700, power consumption can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented combining with another embodiment as appropriate.

EXAMPLE 1

Figure 14A:
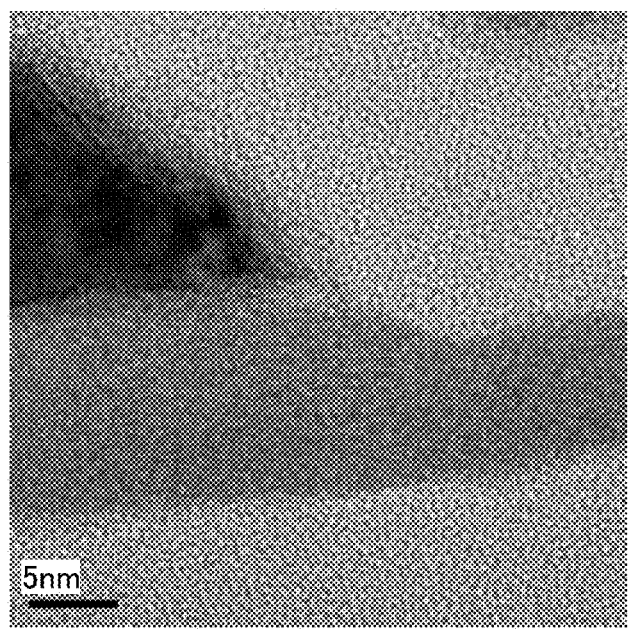
FIGS. 14A and 14B are cross-sectional views illustrating one embodiment of the present invention.
Figure 14B:
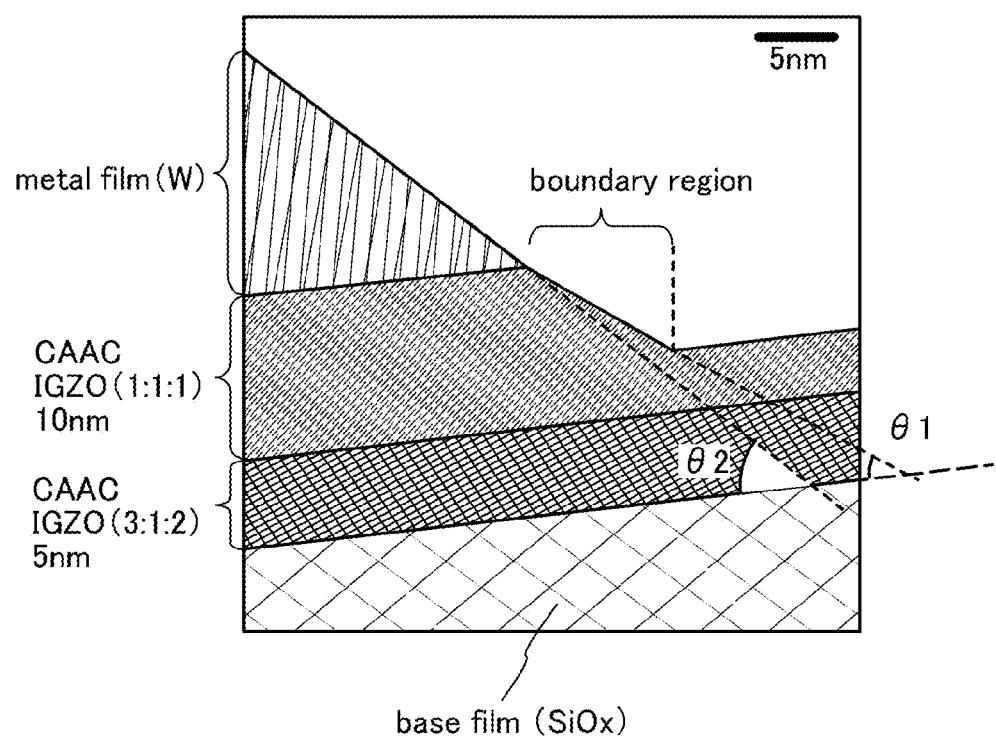
Figure 15A:
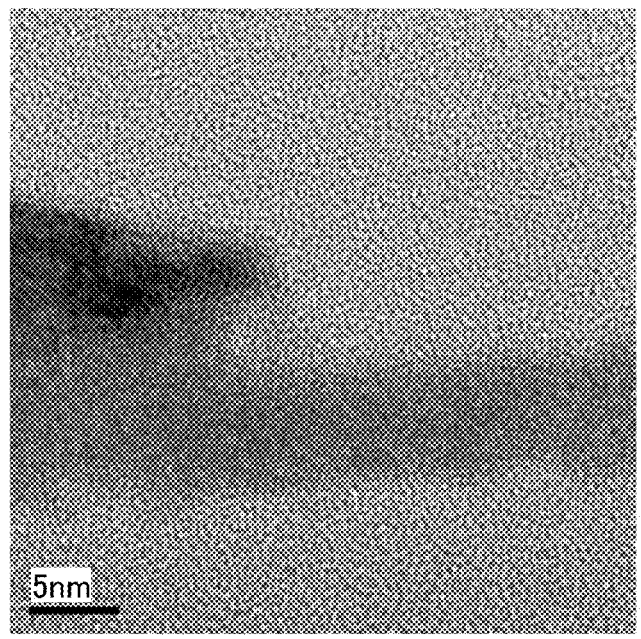
FIGS. 15A and 15B are cross-sectional views for comparison with one embodiment of the present invention.
Figure 15B:
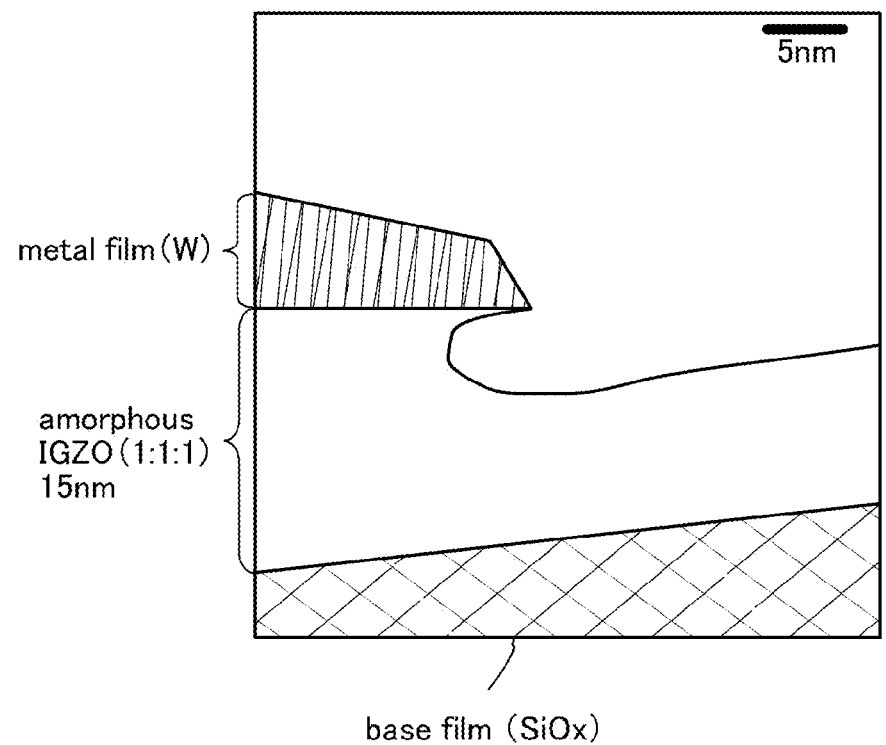

FIGS. 14A and 14B illustrate part of a cross-sectional structure of a transistor including a CAAC-IGZO film and FIGS. 15A and 15B illustrate part of a cross-sectional view of a transistor including an amorphous IGZO film. FIG. 14A and FIG. 15A are cross-sectional TEM images and FIG. 14B and FIG. 15B are schematic cross-sectional views.

To form each of the transistors in this example, a source electrode layer and a drain electrode layer were formed, and then the IGZO film was subjected to wet etching using the electrode layers as masks to form a thin region in the IGZO film. Note that crystal structures of the CAAC-IGZO film and the amorphous IGZO film are in different states (the amorphous IGZO film has lower crystallinity than the CAAC-IGZO film).

Specifically, the wet etching was performed using 0.0025% dilute hydrofluoric acid. Here, 1990 ml of water ($H_2O$) and 10 ml of 0.5% dilute hydrofluoric acid were mixed to obtain the 0.0025% dilute hydrofluoric acid.

Note that the transistors described in the above embodiments each include the CAAC-IGZO film illustrated in FIGS. 14A and 14B. The transistor including the amorphous IGZO film illustrated in FIGS. 15A and 15B was formed for a comparison.

Details of the samples used in this example will be described below.

The CAAC-IGZO film of Sample A illustrated in FIGS. 14A and 14B was formed in such a manner that a first layer was formed using a target containing In, Ga, and Zn at an atomic ratio of 3:1:2 and a second layer formed using a target containing In, Ga, and Zn at an atomic ratio of 1:1:1 was stacked over the first layer. The amorphous IGZO film of Sample B illustrated in FIGS. 15A and 15B was formed using a target containing In, Ga, and Zn at an atomic ratio of 1:1:1 to have a single-layer structure.

<Sample A>

A 300-nm-thick silicon oxide film ($SiO_x$ film) was formed as a base film over a silicon substrate by a sputtering method. After that, the CAAC-IGZO film was formed to a thickness of 15 nm over the base film by a sputtering method. The CAAC-IGZO film was formed in such a manner that a 5-nm-thick CAAC-IGZO film was formed using a target containing In, Ga, and Zn at an atomic ratio of 3:1:2 as the first layer and a 10-nm-thick CAAC-IGZO film formed using a target containing In, Ga, and Zn at an atomic ratio of 1:1:1 was stacked as the second layer over the first layer. Then, a 100-nm-thick tungsten (W) film was formed as a metal film and the metal film was etched by an inductively coupled plasma (ICP) etching method with an ICP etching apparatus.

The $SiO_x$ film was formed under the following conditions: a single crystal silicon target was used, the deposition pressure was 0.4 Pa, the flow rate of Ar was 25 sccm, the flow rate of $O_2$ was 25 sccm, the deposition temperature was 100° C. (substrate temperature was 100° C.), an electrical power of 5 kW was input with the use of a DC power supply, and the distance between the target and the substrate was 60 mm.

The CAAC-IGZO film (3:1:2) was formed under the following conditions: a target containing In, Ga, and Zn at an atomic ratio of 3:1:2 was used, the deposition pressure was 0.4 Pa, the flow rate of Ar was 30 sccm, the flow rate of $O_2$ was 45 sccm, the deposition temperature was 308° C. (substrate temperature was 250° C.), an electrical power of 0.5 kW was input with the use of a DC power supply, and the distance between the target and the substrate was 60 mm.

The CAAC-IGZO film (1:1:1) was formed under the following conditions: a target containing In, Ga, and Zn at an atomic ratio of 1:1:1 was used, the deposition pressure was 0.4 Pa, the flow rate of Ar was 30 sccm, the flow rate of $O_2$ was 45 sccm, the deposition temperature was 416° C. (substrate temperature was 350° C.), an electrical power of 0.5 kW was input with the use of a DC power supply, and the distance between the target and the substrate was 60 mm.

Conditions for the first etching of the W film were as follows: the pressure was 0.67 Pa, the flow rate of $CF_4$ was 55 sccm, the flow rate of $Cl_2$ was 45 sccm, the flow rate of $O_2$ was 55 sccm, the substrate temperature was 40° C., the ICP power was 3000 W (0.76 W/cm$^2$), the bias power was 110 W (0.07 W/cm$^2$), and the etching time was 10 seconds. Through this process, part of the W film was etched to form a thin film region in the W film.

Conditions for the second etching of the W film were as follows: the pressure was 3.0 Pa, the flow rate of $O_2$ was 55 sccm, the substrate temperature was 40° C., the ICP power was 2000 W (0.51 W/cm$^2$), the bias power was 0 W, and the etching time was 15 seconds. Through this process, the area of a resist mask was reduced.

Conditions for the third etching of the W film were as follows: the pressure was 0.67 Pa, the flow rate of $CF_4$ was 55 sccm, the flow rate of Cl$_2$ was 45 sccm, the flow rate of O$_2$ was 55 sccm, the substrate temperature was 40° C., the ICP power was 3000 W (0.76 W/cm$^2$), the bias power was 110 W (0.07 W/cm$^2$), and the etching time was 15 seconds. Through this process, the W film was further etched.

<Sample B>

A 300-nm-thick SiO$_x$ film was formed as a base film over a silicon substrate by a sputtering method. After that, the amorphous IGZO film was formed to a thickness of 15 nm over the base film by a sputtering method. The amorphous IGZO film was formed using a target containing In, Ga, and Zn at an atomic ratio of 1:1:1. Then, a 100-nm-thick W film was formed as a metal film and the metal film was etched by an ICP etching method with an ICP etching apparatus.

The SiO$_x$ film was formed under the following conditions: a single crystal silicon target was used, the deposition pressure was 0.4 Pa, the flow rate of Ar was 25 sccm, the flow rate of O$_2$ was 25 sccm, the deposition temperature was 100° C. (substrate temperature was 100° C.), an electrical power of 5 kW was input with the use of a DC power supply, and the distance between the target and the substrate was 60 mm.

The amorphous IGZO film was formed under the following conditions: a target containing In, Ga, and Zn at an atomic ratio of 1:1:1 was used, the deposition pressure was 0.4 Pa, the flow rate of Ar was 30 sccm, the flow rate of O$_2$ was 15 sccm, the deposition temperature was room temperature (substrate temperature was 23° C. to 25° C.), an electrical power of 0.5 kW was input with the use of a DC power supply, and the distance between the target and the substrate was 60 mm.

Conditions for the first etching of the W film were as follows: the pressure was 0.67 Pa, the flow rate of CF$_4$ was 55 sccm, the flow rate of Cl$_2$ was 45 sccm, the flow rate of O$_2$ was 55 sccm, the substrate temperature was 40° C., the ICP power was 3000 W (0.76 W/cm$^2$), the bias power was 110 W (0.07 W/cm$^2$), and the etching time was 13 seconds.

Conditions for the second etching of the W film were as follows: the pressure was 3.0 Pa, the flow rate of O$_2$ was 55 sccm, the substrate temperature was 40° C., the ICP power was 2000 W (0.51 W/cm$^2$), the bias power was 0 W, and the etching time was 15 seconds.

Conditions for the third etching of the W film were as follows: the pressure was 0.67 Pa, the flow rate of CF$_4$ was 55 sccm, the flow rate of Cl$_2$ was 45 sccm, the flow rate of O$_2$ was 55 sccm, the substrate temperature was 40° C., the ICP power was 3000 W (0.76 W/cm$^2$), the bias power was 110 W (0.07 W/cm$^2$), and the etching time was 12 seconds.

Sample A and Sample B were subjected to wet etching using 0.0025% dilute hydrofluoric acid.

Sample A and Sample B were subjected to wet etching for 86 seconds and 23 seconds, respectively. Sample A and Sample B were etched at 25° C.

In this example, the temperature of dilute hydrofluoric acid is preferably higher than or equal to 25° C. and lower than or equal to 40° C.

In this example, the concentration of dilute hydrofluoric acid is preferably lower than or equal to 0.25%, further preferably lower than or equal to 0.0025% (i.e., 25 ppm). Note that the concentration of dilute hydrofluoric acid is made higher than 0.0001% (i.e., 1 ppm). When the concentration of dilute hydrofluoric acid is higher than 0.0025%, the etching rate of the IGZO film becomes higher, which might result in degradation of the electrical characteristics and a drop in reliability of the transistor described in the above embodiment; accordingly, the concentration of dilute hydrofluoric acid is preferably lower than or equal to 0.0025% to make the IGZO film in a channel formation region thin.

FIGS. 14A and 14B and FIGS. 15A and 15B show the cross-sectional shapes of the CAAC-IGZO film and the amorphous IGZO film after wet etching using dilute hydrofluoric acid.

FIG. 14A shows that the CAAC-IGZO film has a cross-sectional shape in which the thickness of a boundary region between the thin region (region whose thickness is reduced by wet etching) and a thick region increases and the boundary region has a smooth forward tapered slope. With the boundary region, a space between a lower edge portion of the metal film and the thin region can be widened and the CAAC-IGZO film can have a tapered structure in cross-section. The boundary region shown in FIG. 14B, which is a schematic diagram of FIG. 14A, is a region whose thickness gradually increases from a boundary with the thin region toward a boundary with the metal film. A taper angle θ1 formed by a surface of the boundary region and a surface of the oxide insulating film is preferably greater than 0° and less than 90°, further preferably greater than or equal to 20° and less than or equal to 70°. A taper angle θ2 is formed by a side surface of the metal film and the surface of the oxide insulating film. The difference between the taper angle θ1 and the taper angle θ2 is preferably less than or equal to 20°, further preferably less than or equal to 10°, still further preferably 0°. The smaller the difference between the taper angle θ1 and the taper angle θ2 is, the smoother a boundary between the side surface of the metal film and the surface of the boundary region is. FIG. 14A shows that the taper angle θ1 and the taper angle θ2 are each less than 90°. Here, the taper angle θ1 is formed by, in the cross-sectional shape of the oxide semiconductor film, the surface of the oxide insulating film and the surface of the boundary region (slope between the thick region and the thin region). Although FIG. 14B shows the taper angle θ1 and the taper angle θ2 as angles formed with the surface of the oxide insulating film serving as the base film (SiO$_x$ film), the taper angle θ1 and the taper angle θ2 can be formed with a substrate surface because the substrate surface is almost parallel to the surface of the base film. In the case of providing a conductive layer or the like between the oxide insulating film serving as the base film (SiO$_x$ film) and the substrate, the surface of the oxide insulating film is not flat and is not suitable as the reference surface. In such a case, the taper angle θ1 and the taper angle θ2 can be formed with the substrate surface. Note that the film under the metal (W) film used as a mask is not etched, which indicates that the CAAC-IGZO film is etched anisotropically.

In the amorphous IGZO film in FIG. 15A, a region under the metal (W) film used as the mask is etched by wet etching to form an overhang shape, which indicates that the amorphous IGZO film is etched isotropically.

From the results shown in FIG. 14A and FIG. 15A, it can be considered that the difference in the crystal structure caused the difference in the cross-sectional shapes between the CAAC-IGZO film and the amorphous IGZO film after wet etching. This suggests that the difference in the crystal structures between the CAAC-IGZO film and the amorphous IGZO film affects the etching direction and the etching rate.

The results also indicate that since the surface of the boundary region of the CAAC-IGZO film and the side surface of the edge portion of the metal film are smooth (i.e., provided in substantially the same plane), the coverage with a gate insulating film and a gate electrode layer to be formed over the CAAC-IGZO film can be improved in comparison with the amorphous IGZO film. Further, even when the thickness of the gate insulating film is small, disconnection of the gate insulating film is unlikely to occur.

In addition, the results suggest that by wet etching using dilute hydrofluoric acid performed on the CAAC-IGZO film, the thickness of the channel formation region can be controlled more accurately.

EXAMPLE 2

In this example, it will be shown with reference to FIGS. 16 to 20 that wet etching using dilute hydrofluoric acid performed on a CAAC-IGZO film enables contaminants adhered to the vicinity of the CAAC-IGZO film to be greatly reduced. The contaminants are $Cl_2$, C, and F due to a process gas (a $CF_4$ gas and a $Cl_2$ gas) for etching of a metal (W) film; B scattered from a glass fiber used for a high efficiency particulate air (HEPA) filter in an etching chamber; Al due to components of the etching chamber; and the like.

The measurements were performed by secondary ion mass spectrometry (SIMS). When a surface of a sample is irradiated with ions (primary ions), a variety of particles such as electrons, neutral particles, and ions are released from the surface of the sample. In secondary ion mass spectrometry, ions (secondary ions) are subjected to mass separation and the amount of the separated secondary ions is measured to conduct qualitative and quantitative analyses of the components of the sample.

Details of samples used for the measurements in this example will be described below.

Figure 21A:
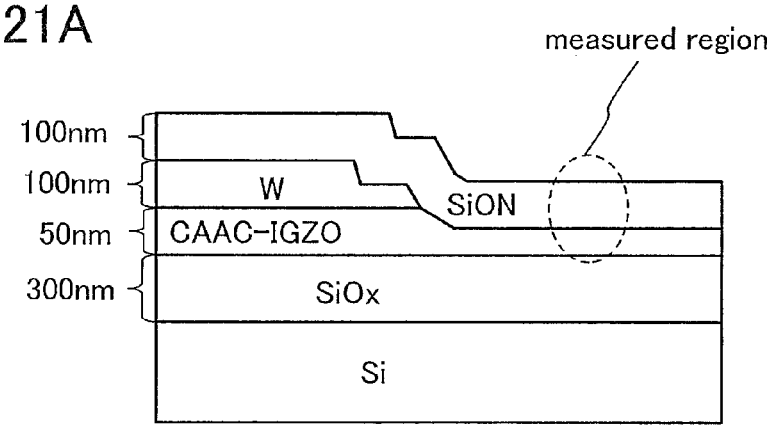
FIGS. 21A and 21B show a sample of one embodiment of the present invention and a comparative sample, respectively.
Figure 21B:
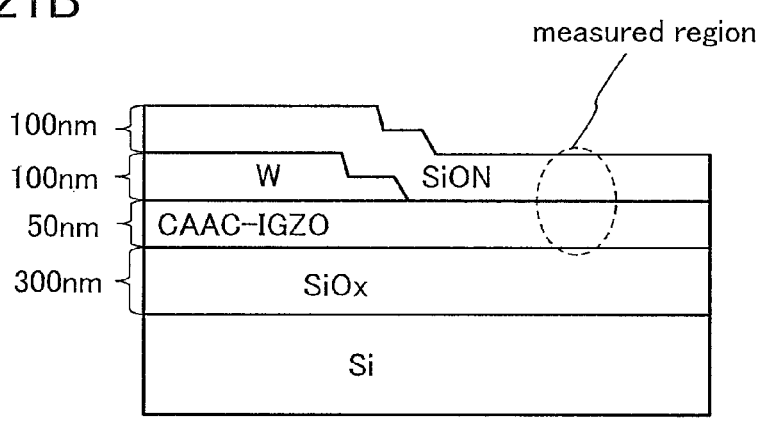

Sample C and Sample D illustrated in FIGS. 21A and 21B were used for the measurements. Sample C illustrated in FIG. 21A is different from Sample D illustrated in FIG. 21B only in that Sample C was subjected to wet etching using 0.0025% dilute hydrofluoric acid, and the other conditions were the same. Note that Sample C and Sample D each included a single layer of a CAAC-IGZO film formed using a target containing In, Ga, and Zn at an atomic ratio of 1:1:1.

<Sample C and Sample D>

A 300-nm-thick $SiO_x$ film was formed as a base film over a silicon substrate by a sputtering method. After that, a 50-nm-thick CAAC-IGZO film was formed over the base film by a sputtering method. Then, a 100-nm-thick W film was formed as a metal film and the metal film was etched by an ICP etching method with an ICP etching apparatus. After that, a 100-nm-thick silicon oxynitride film (also referred to as an SiON film) was formed as a gate insulating film by a PCVD method over the CAAC-IGZO film and the metal film.

The $SiO_x$ film was formed under the following conditions: a single crystal silicon target was used, the deposition pressure was 0.4 Pa, the flow rate of Ar was 25 sccm, the flow rate of $O_2$ was 25 sccm, the deposition temperature was 100° C. (substrate temperature was 100° C.), an electrical power of 5 kW was input with the use of a DC power supply, and the distance between the target and the substrate was 60 mm.

The CAAC-IGZO film was formed under the following conditions: a target containing In, Ga, and Zn at an atomic ratio of 1:1:1 was used, the deposition pressure was 0.4 Pa, the flow rate of Ar was 30 sccm, the flow rate of $O_2$ was 45 sccm, the deposition temperature was 416° C. (substrate temperature was 350° C.), electrical power of 0.5 kW was input with the use of a DC power supply, and the distance between the target and the substrate was 60 mm.

Conditions for the first etching of the W film were as follows: the pressure was 0.67 Pa, the flow rate of $CF_4$ was 55 sccm, the flow rate of $Cl_2$ was 45 sccm, the flow rate of $O_2$ was 55 sccm, the substrate temperature was 40° C., the ICP power was 3000 W (0.76 W/cm$^2$), the bias power was 110 W (0.07 W/cm$^2$), and the etching time was 13 seconds.

Conditions for the second etching of the W film were as follows: the pressure was 3.0 Pa, the flow rate of $O_2$ was 55 sccm, the substrate temperature was 40° C., the ICP power was 2000 W (0.51 W/cm$^2$), the bias power was 0 W, and the etching time was 15 seconds.

Conditions for the third etching of the W film were as follows: the pressure was 0.67 Pa, the flow rate of $CF_4$ was 55 sccm, the flow rate of $Cl_2$ was 45 sccm, the flow rate of $O_2$ was 55 sccm, the substrate temperature was 40° C., the ICP power was 3000 W (0.76 W/cm$^2$), the bias power was 110 W (0.07 W/cm$^2$), and the etching time was 12 seconds.

The conditions for forming the SiON film were as follows: the deposition pressure was 40 Pa, the flow rate of $SiH_4$ was 1 sccm, the flow rate of $N_2O$ was 800 sccm, and the deposition temperature was 400° C. (substrate temperature was 400° C.).

The fabricated Sample C was subjected to wet etching using 0.0025% dilute hydrofluoric acid.

Sample C was subjected to wet etching at a temperature higher than or equal to 25° C. and lower than or equal to 40° C. for 72 seconds.

FIGS. 16 to 20 show the measurement results.

Figure 16:
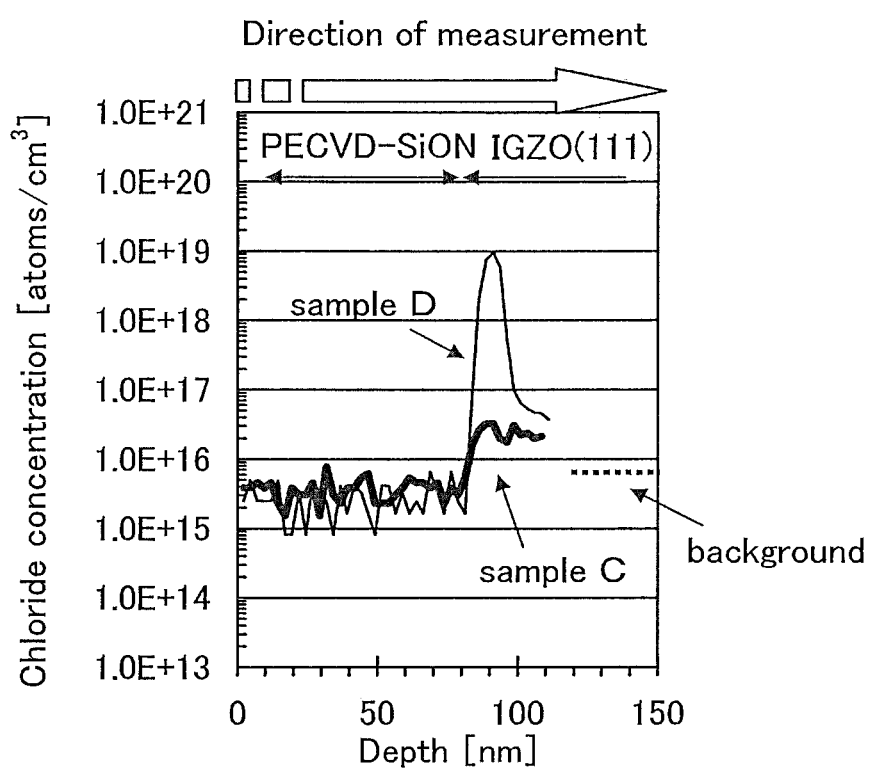
FIG. 16 shows measurement results by SIMS in one embodiment of the present invention.

FIG. 16 is a graph showing comparison result of the concentrations of Cl (atoms/cm$^3$) in the vicinity of the CAAC-IGZO films in Sample C and Sample D. It is obvious that Sample D contains a larger amount of Cl in the vicinity of the CAAC-IGZO film than Sample C.

Figure 17:
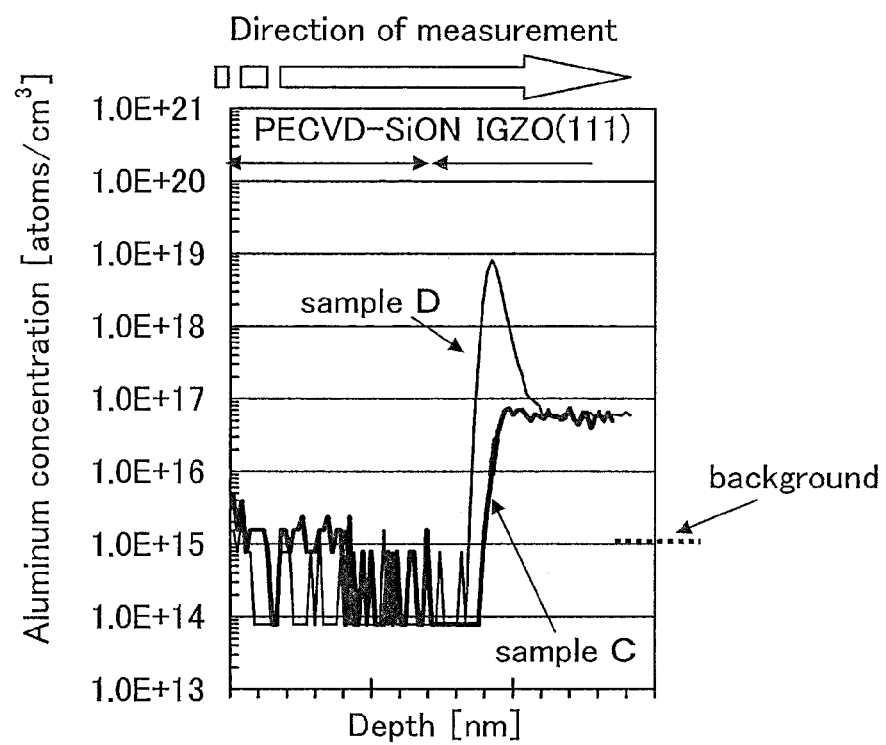
FIG. 17 shows measurement results by SIMS in one embodiment of the present invention.

FIG. 17 is a graph showing comparison result of the concentrations of Al (atoms/cm$^3$) in the vicinity of the CAAC-IGZO films in Sample C and Sample D. It is obvious that Sample D contains a larger amount of Al in the vicinity of the CAAC-IGZO film than Sample C.

Figure 18:
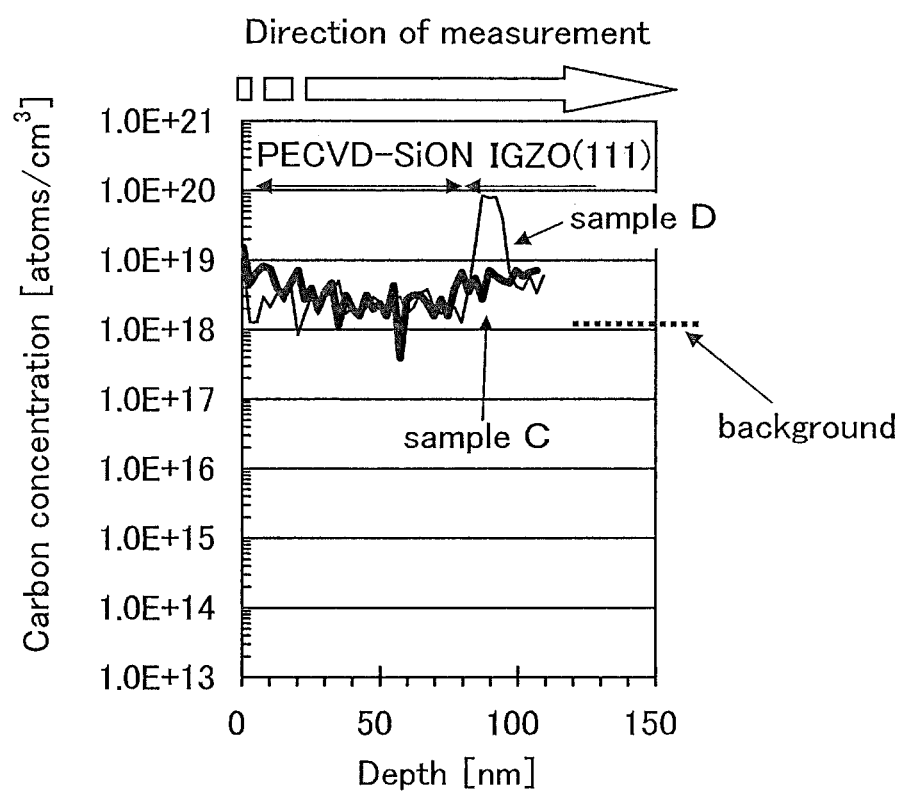
FIG. 18 shows measurement results by SIMS in one embodiment of the present invention.

FIG. 18 is a graph showing comparison result of the concentrations of C (atoms/cm$^3$) in the vicinity of the CAAC-IGZO films in Sample C and Sample D. It is obvious that Sample D contains a larger amount of C in the vicinity of the CAAC-IGZO film than Sample C.

Figure 19:
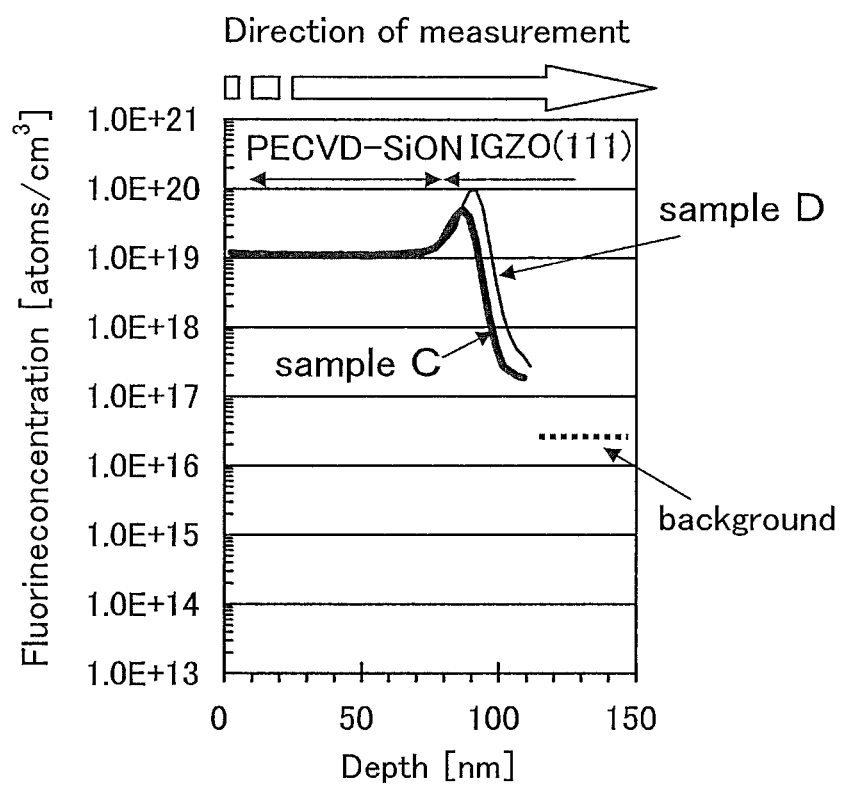
FIG. 19 shows measurement results by SIMS in one embodiment of the present invention.

FIG. 19 is a graph showing comparison result of the concentrations of F (atoms/cm$^3$) in the vicinity of the CAAC-IGZO films in Sample C and Sample D. FIG. 19 shows that Sample D contains a larger amount of F in the vicinity of the CAAC-IGZO film than Sample C.

Figure 20:
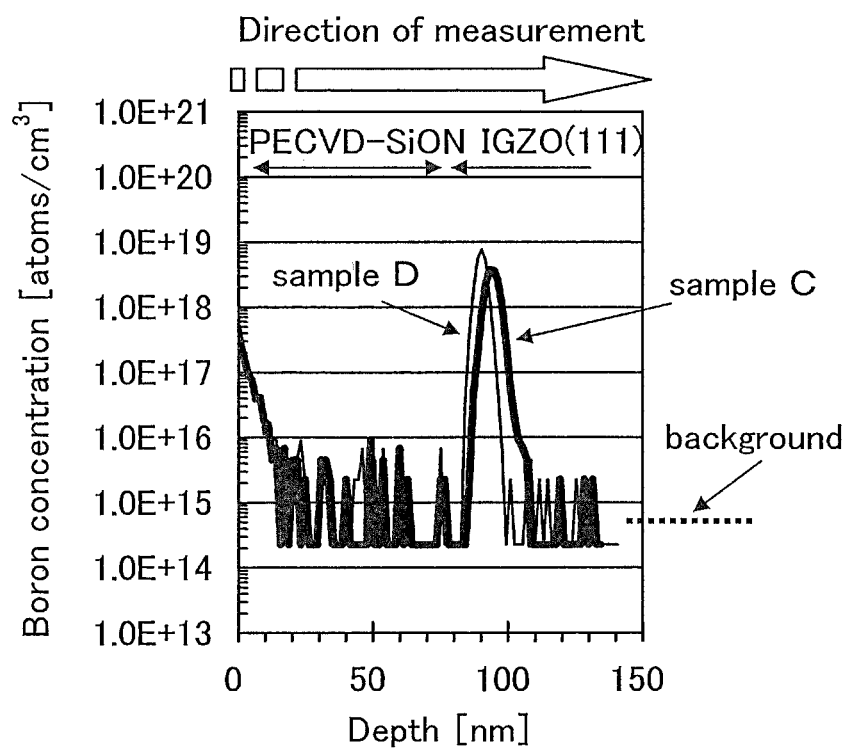
FIG. 20 shows measurement results by SIMS in one embodiment of the present invention.

FIG. 20 is a graph showing comparison result of the concentration of B (atoms/cm$^3$) in the vicinity of the CAAC-IGZO films in Sample C and Sample D. FIG. 20 shows that Sample D contains a larger amount of B in the vicinity of the CAAC-IGZO film than Sample C.

The above measurement results in FIGS. 16 to 20 indicate that when the CAAC-IGZO film is subjected to wet etching using dilute hydrofluoric acid, contaminants remaining in the vicinity of the CAAC-IGZO film can be greatly reduced. The contaminants are likely to result in degradation of the switching characteristics and variations in electrical characteristics of a transistor. Thus, a great reduction in the contaminants which adversely affect the performance of the transistor probably enables a semiconductor device including a transistor in which the CAAC-IGZO film subjected to wet etching using dilute hydrofluoric acid is used in a channel formation region to have stable electrical characteristics and improved reliability.

EXAMPLE 3

In this example, a CAAC-IGZO film and an amorphous IGZO film were subjected to wet etching using dilute hydrofluoric acid and the etching rate (nm/min) in wet etching was measured. The measurement results below show that a transistor including a CAAC-IGZO film with a thin channel formation region can have higher performance than a transistor including an amorphous IGZO film with a thin channel formation region.

The samples used in this example have structures similar to those of Sample A and Sample B in Example 1; thus, Example 1 can be referred to for details.

Each of a sample including a CAAC-IGZO film and a sample including an amorphous IGZO film was subjected to wet etching using 0.0025% dilute hydrofluoric acid under the etching conditions similar to those in Example 1.

The etching rates were measured with a spectroscopic ellipsometer UT-300. Each sample with sides of 5 inches (12.7 centimeters) was measured at 25 points on plane and the obtained 25 values were averaged.

The average etching rate of the CAAC-IGZO film was approximately 4.3 nm/min and the average etching rate of the amorphous IGZO film was approximately 12.9 nm/min. The measurement results show that the etching rate of the amorphous IGZO film is about three times as high as that of the CAAC-IGZO film. This means that the thickness of the CAAC-IGZO film can be controlled easily as compared with the amorphous IGZO film.

Since the etching rate of the CAAC-IGZO film is low, the use of dilute hydrofluoric acid for wet etching on the CAAC-IGZO film probably enables the thickness of the CAAC-IGZO film in a channel formation region to be controlled more accurately. Further, even in the case where a gate insulating film to be formed over the CAAC-IGZO film is thinner than the oxide semiconductor film, the coverage with the gate insulating film can be improved. In other words, with the CAAC-IGZO film whose channel formation region is thinned by wet etching using dilute hydrofluoric acid, the performance of a transistor can be improved.

This application is based on Japanese Patent Application serial no. 2012-144728 filed with Japan Patent Office on Jun. 27, 2012, the entire contents of which are hereby incorporated by reference.

What is claimed is:

1. A method for manufacturing a semiconductor device, comprising the steps of:
    forming an oxide semiconductor layer;
    forming a source electrode layer and a drain electrode layer over the oxide semiconductor layer; and
    exposing a part of the oxide semiconductor layer to diluted hydrofluoric acid after the formation of the source electrode layer and the drain electrode layer,
    wherein a concentration of the diluted hydrofluoric acid is higher than 0.0001% and lower than or equal to 0.25%.

2. The method according to claim 1, wherein the oxide semiconductor layer has a crystal structure.

3. The method according to claim 1, wherein the step of forming the oxide semiconductor layer comprises the steps of:
    forming a first oxide semiconductor layer;
    forming a second oxide semiconductor layer over the first oxide semiconductor layer; and
    forming a third oxide semiconductor layer over the second oxide semiconductor layer.

4. The method according to claim 1, wherein the oxide semiconductor layer comprises indium, gallium, and zinc.

5. The method according to claim 1, further comprising the step of:
    forming a gate electrode layer before the formation of the oxide semiconductor layer.

6. A method for manufacturing a semiconductor device, comprising the steps of:
    forming an oxide semiconductor layer over an insulating surface;
    forming a source electrode layer and a drain electrode layer over the oxide semiconductor layer;
    exposing a part of the oxide semiconductor layer to diluted hydrofluoric acid after the formation of the source electrode layer and the drain electrode layer;
    forming an insulating layer over the oxide semiconductor layer, the source electrode layer, and the drain electrode layer; and
    forming a gate electrode layer over the insulating layer, the gate electrode layer overlapping with the oxide semiconductor layer,
    wherein a concentration of the diluted hydrofluoric acid is higher than 0.0001% and lower than or equal to 0.25%.

7. The method according to claim 6, wherein the oxide semiconductor layer has a crystal structure.

8. The method according to claim 6, wherein the step of forming the oxide semiconductor layer comprises the steps of:
    forming a first oxide semiconductor layer;
    forming a second oxide semiconductor layer over the first oxide semiconductor layer; and
    forming a third oxide semiconductor layer over the second oxide semiconductor layer.

9. The method according to claim 6, wherein the oxide semiconductor layer comprises indium, gallium, and zinc.

10. The method according to claim 6, wherein the step of forming the gate electrode layer comprises the steps of:
    forming a first gate electrode layer; and
    forming a second gate electrode layer over the first gate electrode layer.

11. The method according to claim 6, further comprising the step of:
    forming a wiring electrically connected to one of the source electrode layer and the drain electrode layer,
    wherein the wiring comprises copper.

12. A method for manufacturing a semiconductor device, comprising the steps of:
    forming a first electrode layer over an insulating surface;
    forming a first insulating layer over the first electrode layer;
    forming an oxide semiconductor layer over the first insulating layer;
    forming a source electrode layer and a drain electrode layer over the oxide semiconductor layer;
    exposing a part of the oxide semiconductor layer to diluted hydrofluoric acid after the formation of the source electrode layer and the drain electrode layer;
    forming a second insulating layer over the oxide semiconductor layer, the source electrode layer, and the drain electrode layer; and
    forming a second electrode layer over the second insulating layer, the second electrode layer overlapping with the oxide semiconductor layer,
    wherein a concentration of the diluted hydrofluoric acid is higher than 0.0001% and lower than or equal to 0.25%.

13. The method according to claim 12 wherein the oxide semiconductor layer has a crystal structure.

14. The method according to claim 12, wherein the step of forming the oxide semiconductor layer comprises the steps of:
    forming a first oxide semiconductor layer;
    forming a second oxide semiconductor layer over the first oxide semiconductor layer; and
    forming a third oxide semiconductor layer over the second oxide semiconductor layer.

15. The method according to claim 12, wherein the oxide semiconductor layer comprises indium, gallium, and zinc.

16. The method according to claim 12, wherein the step of forming the second electrode layer comprises the steps of:
   forming a first gate electrode layer; and
   forming a second gate electrode layer over the first gate electrode layer.

17. The method according to claim 12, further comprising the step of:
   forming a wiring electrically connected to one of the source electrode layer and the drain electrode layer,
   wherein the wiring comprises copper.

18. The method according to claim 12, wherein the first electrode layer is a back gate electrode layer.

19. The method according to claim 12, wherein the first electrode layer overlaps with the oxide semiconductor layer.

20. The method according to claim 12, further comprising the step of:
   adding oxygen to the first insulating layer.

* * * * *